United States Patent [19]

Murakami et al.

[11] Patent Number: 6,047,116
[45] Date of Patent: Apr. 4, 2000

[54] METHOD FOR GENERATING EXPOSURE DATA FOR LITHOGRAPHIC APPARATUS

[75] Inventors: Eiji Murakami, Kawasaki; Hitoshi Higurashi, Yokohama; Shigehiro Hara, Yokohama; Kiyomi Koyama, Yokohama; Takayuki Abe, Kawasaki, all of Japan

[73] Assignee: Kabushiki Kaisha Toshiba, Kawasaki, Japan

[21] Appl. No.: 09/040,343

[22] Filed: Mar. 18, 1998

[30] Foreign Application Priority Data

Mar. 18, 1997 [JP] Japan ................................ 9-065149

[51] Int. Cl.[7] .................................................. G06F 17/50
[52] U.S. Cl. ................................ 395/500.2; 395/500.21; 395/500.22
[58] Field of Search ............................ 395/500.2, 500.21, 395/500.22

[56] References Cited

U.S. PATENT DOCUMENTS 5,526,279  6/1996  Dick ..................................... 395/500.2

FOREIGN PATENT DOCUMENTS 57-122529  7/1982  Japan .
5-29202  2/1993  Japan .
7-283102  10/1995  Japan .

OTHER PUBLICATIONS

Shunko Magoshi, et al., "High–Speed Electron Beam Data Conversion System Combining Hierarchical Operation with Parallel Processsing", Japanese Journal of Applied Physics, vol. 31, No. 12B, Part 1, Dec. 1992, pp. 4257–4261.

Kiyomi Koyama, et al., "Shape Data Operations for VSB EB Data Conversion Using CAD Tools", Japanese Journal of Applied Physics, vol. 28, No. 11, Nov. 1989, pp. 2329–2332.

Tsuneo Okubo, et al., "New Algorithm for Overlapping Cell Treatment in Hierarchical CAD Data/Electron Beam Exposure Data Conversion", Proc. of 27th ACM/IEEE Design Automation Conference, (1990), pp. 321–326.

*Primary Examiner*—Kevin J. Teska
*Assistant Examiner*—Hugh Jones
*Attorney, Agent, or Firm*—Oblon, Spivak, McClelland, Maier & Neustadt, P.C.

[57] ABSTRACT

In a method of generating from design data the exposure data necessary for a multistage-deflection charged beam exposure device that has a main deflector and a sub-deflector and forms a pattern, before a shape larger than the size of a minimum subfield area is divided during the generation of subfield exposure data, the process of dividing the shape into shapes equal to or smaller than the size of a subfield area and restructuring the shape is performed. Moreover, after the overlapping cell arrays in the design data are changed into a cell array structure preventing the cell arrays from overlapping, the resulting cell arrays are subjected to a hierarchical shape data operation process and a formatting process, including compression, subfield division, and frame division. This makes it possible to reduce the amount of data supplied without increasing the time required to converting the design data into exposure data supplied to the charged beam exposure device.

11 Claims, 43 Drawing Sheets

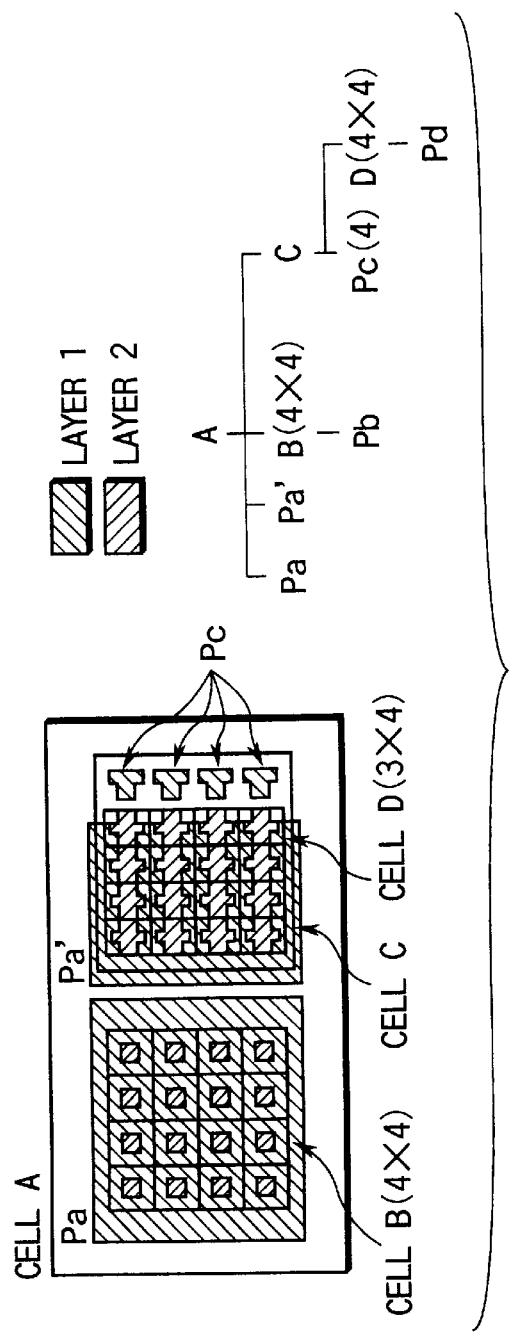
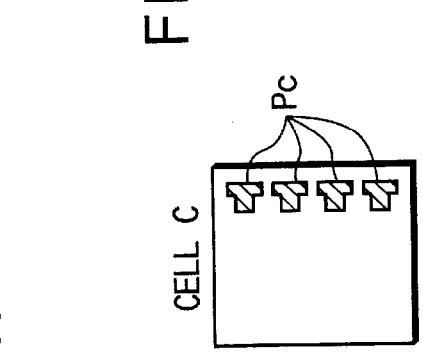
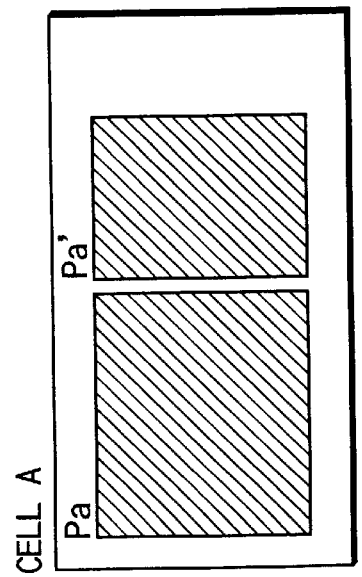
FIG. 11A
FIG. 11B
FIG. 11C
FIG. 11D
FIG. 11E

CELL A

| INSTANCE INFORMATION | | PATTERN OF CELL A | |
|---|---|---|---|
| NUMBER OF INSTANCES | 0 | CELL ID | A |
| | | LAYER | 1 |
| | | NUMBER OF SHAPE DEFINITIONS | 0 |
| | | LAYER | 2 |
| | | NUMBER OF SHAPE DEFINITIONS | 1 |
| | | NUMBER OF VERTEXES OF SHAPE 1 | 4 |
| | | X COORDINATE OF 1st VERTEX | xa1 |
| | | Y COORDINATE OF 1st VERTEX | ya1 |
| | | X COORDINATE OF 2nd VERTEX | xa2 |
| | | Y COORDINATE OF 2nd VERTEX | ya2 |
| | | X COORDINATE OF 3rd VERTEX | xa3 |
| | | Y COORDINATE OF 3rd VERTEX | ya3 |
| | | X COORDINATE OF 4th VERTEX | xa4 |
| | | Y COORDINATE OF 4th VERTEX | ya4 |

CELL B

| INSTANCE INFORMATION | | PATTERN OF CELL B | |
|---|---|---|---|
| NUMBER OF INSTANCES | 1 | CELL ID | B |
| INSTANCE CELL ID | A | LAYER | 1 |
| LOCATION COORDINATE X | Xa | NUMBER OF SHAPE DEFINITIONS | 1 |
| LOCATION COORDINATE Y | Ya | NUMBER OF VERTEXES OF SHAPE 1 | 4 |
| ARRAY REPETITION NUMBER Xr | 1 | X COORDINATE OF 1st VERTEX | xb1 |
| ARRAY REPETITION NUMBER Yr | 1 | Y COORDINATE OF 1st VERTEX | yb1 |
| ARRAY PITCH Xp | 0 | X COORDINATE OF 2nd VERTEX | xb2 |
| ARRAY PITCH Yp | 0 | Y COORDINATE OF 2nd VERTEX | yb2 |
| | | X COORDINATE OF 3rd VERTEX | xb3 |
| | | Y COORDINATE OF 3rd VERTEX | yb3 |
| | | X COORDINATE OF 4th VERTEX | xb4 |
| | | Y COORDINATE OF 4th VERTEX | yb4 |
| | | LAYER | 2 |
| | | NUMBER OF SHAPE DEFINITIONS | 0 |

CELL C

| INSTANCE INFORMATION | | PATTERN OF CELL C | |
|---|---|---|---|
| NUMBER OF INSTANCES | 1 | CELL ID | C |
| INSTANCE CELL ID | B | LAYER | 1 |
| LOCATION COORDINATE X | Xb | NUMBER OF SHAPE DEFINITIONS | 0 |
| LOCATION COORDINATE Y | Yb | LAYER | 2 |
| ARRAY REPETITION NUMBER Xr | 2 | NUMBER OF SHAPE DEFINITIONS | 0 |
| ARRAY REPETITION NUMBER Yr | 2 | | |
| ARRAY PITCH Xp | Xp | | |
| ARRAY PITCH Yp | Yp | | |

FIG. 22

CELL A
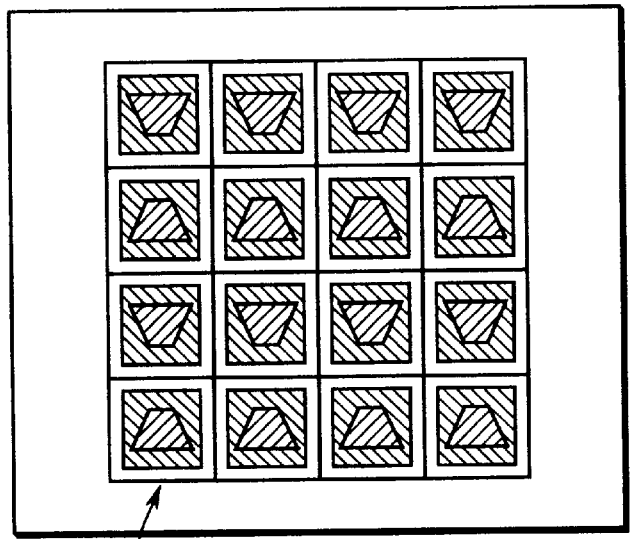
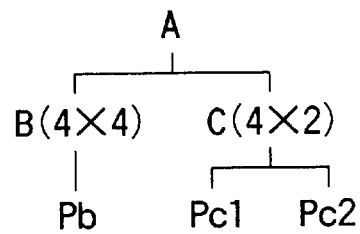
OVERLAPPED CELL B(4×4) AND
CELL C(4×2)
FIG. 30A
CELL B
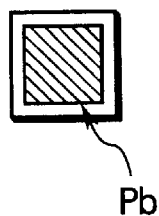
FIG. 30B
CELL C
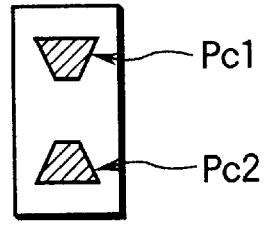
FIG. 30C

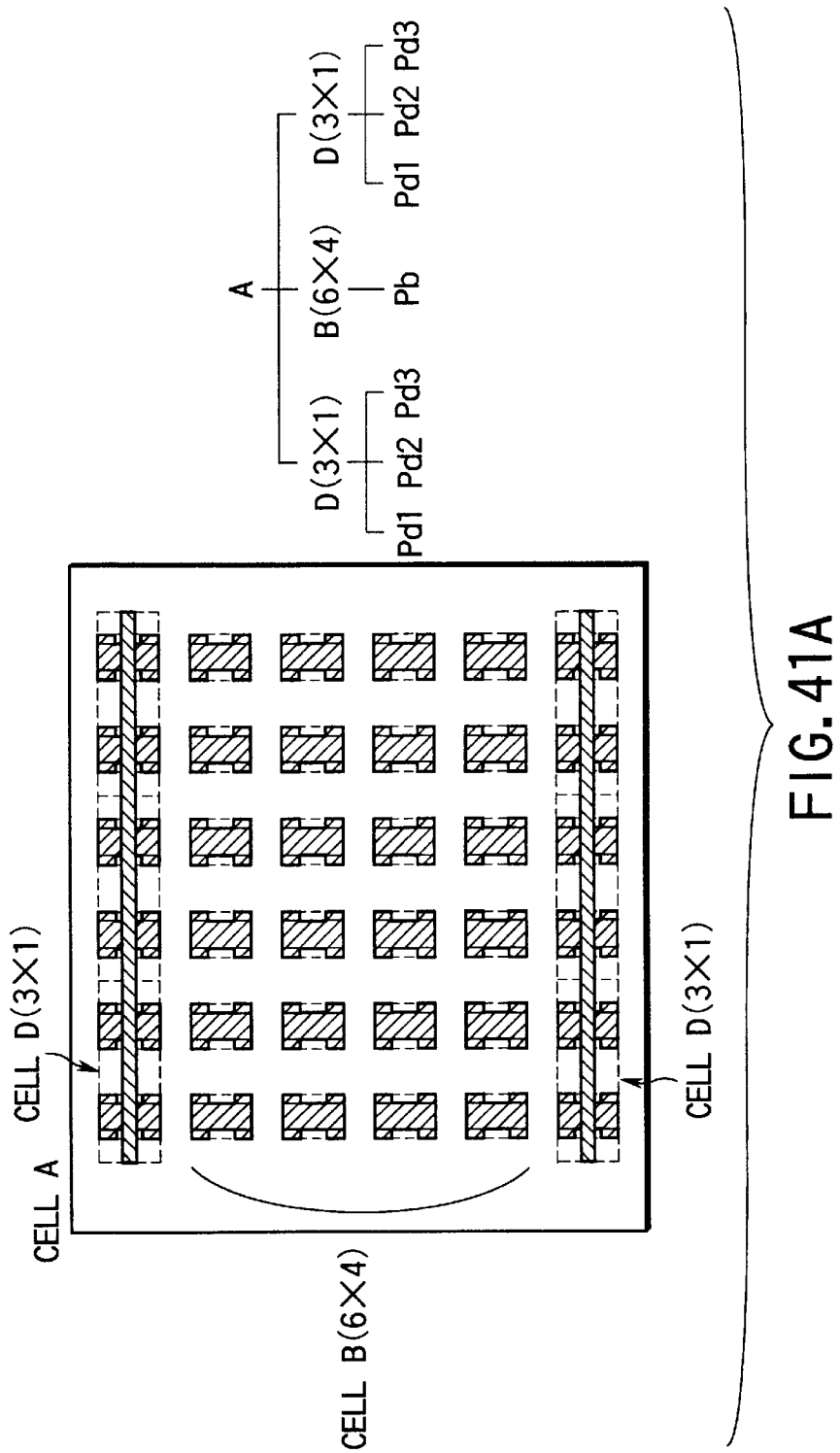
FIG. 41A
FIG. 41B
FIG. 41C

METHOD FOR GENERATING EXPOSURE DATA FOR LITHOGRAPHIC APPARATUS

BACKGROUND OF THE INVENTION

This invention relates to the techniques for forming a specific pattern for a semiconductor integrated circuit, such as LSI, on a specimen, such as a mask or a wafer, using a charged beam at high speed with high accuracy, and more particularly to a method for generating exposure data for lithographic apparatus from the design data on the pattern.

This application is based on Japanese Patent Application No. 9-65149, filed Mar. 18, 1997, the content of which is incorporated herein by reference.

As semiconductor integrated circuits have been getting much larger and circuit elements have been getting much smaller, the techniques for forming a pattern on a wafer or a mask with an exposure device have been developed. To form a specific pattern on a wafer or a mask with an exposure device based on the LSI design pattern data generated through logic design, circuit design, and layout design, it is necessary to convert the design pattern data into exposure data that the exposure device can deal with.

In the process of converting the design data into the exposure data, when the design data has a multilayer cell structure, it is necessary to convert the multilayer cell structure into a single-layer cell structure, since the exposure data cannot have more than one layer for each mask or wafer. To prevent a decrease in the writing accuracy due to multiple exposure caused by the overlapping of patterns, the overlapping removal of patterns should be performed. Also the following processes are performed in general: the size correction to enlarge or reduce the design data, and the division of the corrected patterns into patterns of basic unit shapes that the exposure device can print.

In the design data, LSI patterns are defined on layers. The multiple layers of pattern data defined in the design data are subjected to Boolean shape data operations, such as AND, OR, EXOR, or NOT operation to create pattern data defined by a single layer that can be inputted to an exposure device. This method has been used frequently.

In recent years, the techniques for compressing exposure data in converting design data into exposure data to reduce the amount of exposure data transferred to an exposure device have been proposed. One technique has been disclosed in Japanese Patent Disclosure (KOKAI) No. 5-29202. The disclosed technique is to divide a pattern (the shaded portion indicates the exposure section) as shown in FIG. 1 into subfields in an electron beam exposure device to produce unit shapes, acquire information on the arrangement of unit shapes, and compress the amount of data.

This type of conventional technique has the following problem. The time required to convert design data into exposure data increases, because unit shapes for data compression are generated after the design data is exploded on the entire surface of a specimen and then is divided into grid-like subfields peculiar to an exposure device and further because information on the arrangement of unit shapes is acquired. Since unit shapes are generated in subfields, the pattern of an odd portion smaller than a subfield cannot be compressed using unit shapes. This causes the problem of not compressing the amount of data so much as the data conversion time increases.

For the techniques for shortening the data conversion time and compressing the amount of data, a hierarchical data conversion method making use of a cell hierarchical structure in the design data has been proposed.

The hierarchical data conversion method has been described in, for example, "High-speed Electron Beam Data Conversion System Combining Hierarchical Operation with Parallel Processing," Japanese Journal of Applied Physics Volume 31, pp. 4257–4261, 1992 (hereinafter, referred to as reference 1). In reference 1, if the hierarchical data conversion method is naively applied to original CAD data to produce exposure data, there is a chance that double-exposed exposure patterns or exposure pattern with a gap between them may be generated. As a result, such exposure data may not be accepted by an electron beam exposure device. To overcome this problem, the following approach has been proposed in reference 1: when cells overlap at least partially in the design data, the cells are expanded into the parent cell which refers those cells at one level higher in the hierarchy (hereinafter, such an expansion is referred to as explosion) (removal of overlapping cells) to change the hierarchical structure and the resulting design data is subjected to a hierarchical shape data operation, thereby converting the design data into the pattern data for an electron beam exposure device properly. Hereinafter, the process of changing the hierarchical structure, such as removal of overlapping cells, needed in converting the design data hierarchically into writing pattern data is referred as the hierarchical optimization process.

When master cells which are referred, 2-to plural times in the design data are exploded, the removal of overlapping cells causes the problem of decreasing the efficiency in shortening the processing time by the hierarchical processing and the efficiency in compressing the amount of data. Specifically, when the array of a cell overlaps with a single shape or with another cell in the design data, or when the arrays of different cells overlap, the efficiency in shortening the processing time by the hierarchical process and the data-amount compression efficiency decreases.

One approach to solve this problem has been described in "New Algorithm for Overlapping Cell Treatment in Hierarchical CAD Data/Electron Beam Exposure Data Conversion," Proceedings of 27th ACM/IEEE Design Automation Conference, pp. 321–326, 1990 (hereinafter, referred to as reference 2). In reference 2, when cells overlap in a hierarchical shape data operation process, objects of cell explosion are limited to overlaps between cells more than one level apart in the hierarchy. Stated another way, if the cell overlaps the other cell whose level in a hierarchical tree is upper or lower by only one level than that of the cell, the cell is not exploded into the cell at a higher level hierarchy. Instead, the shapes overlapping between cells are attached marks and subjected to suitable shape data operations, thereby increasing the efficiency of the hierarchical process remarkably.

Any of the above conventional techniques, however, has not disclosed a method of suppressing cell explosion in the case of the overlapping of cells in array arrangement contributing to the most serious decrease in the efficiency of the hierarchical process. Additionally, it has not disclosed a method of avoiding cell explosion as much as possible and hierarchically converting the design data properly, when shape data operations are performed on more than one layer of the design data.

BRIEF SUMMARY OF THE INVENTION

Accordingly, it is an object of the present invention to provide a method of generating exposure data for lithographic apparatus in a short time, while compressing the amount of exposure data.

Another object of the present invention is to provide a method of generating exposure data for lithographic apparatus which is capable of minimizing cell explosion leading to a decrease in the efficiency of hierarchical shape data operation and reducing the exposure data generating time and the amount of exposure data, when the array of a cell overlaps with a single shape or another cell or when the arrays of different cells overlap.

Still another object of the present invention is to provide a method of generating exposure data for lithographic apparatus which is capable of reducing the exposure data generating time and the amount of exposure data, even when cells overlap in a data generation process including a shape data operation process intended for more than one layer of design data.

According to the present invention, there is provided a method of generating from design data exposure data necessary to form a pattern on a specimen with a multistage-deflection charged beam exposure device having a main deflector and at least one sub-deflector, the method comprising the following steps of compressing multilayer design data by dividing a pattern larger than the size corresponding to the minimum subfield area into a pattern equal to or smaller than the size of the subfield area to prevent the pattern from being divided during the generation of subfield exposure data; and generating subfield exposure data based on the compressed design data.

According to the present invention, there is provided another method of generating from design data exposure data necessary to form a pattern on a specimen with a multistage-deflection charged beam exposure device having a main deflector and at least one sub-deflector, the method comprising the following steps of compressing multilayer design data by extracting same patterns from patterns in a cell and rearranging the extracted patterns in another cell; and generating subfield exposure data based on the compressed design data.

According to the present invention, there is provided another method of generating from design data defined on a multilayer cell structure exposure data necessary to form a pattern on a specimen with a charged beam or laser-beam exposure device, the method comprising the following steps of subjecting a hierarchical structure of the design data to an optimization process; and converting the design data into exposure data by subjecting the design data at each level of hierarchy to a specific shape data operation process intended for at least one layer, wherein the step of subjecting the hierarchical structure to the optimization process comprises the following substeps of finding an area in which child cells defined for reference in a parent cell in the design data are completely covered with a shape belonging to the parent cell; determining an outline frame used to put a shape in the parent cell into a child cell in the area; and deleting the shape in the parent cell existing in the outline frame from the parent cell and of, when a child cell is in a single arrangement, putting the deleted shape into the child cell and registering the resulting cell as a new child cell, or when a child cell is in an array arrangement, extracting a rectangular portion defined on an array repetition unit lengths in the directions of x and y of the child cell from the deleted shape and putting the extracted portion into the child cell to form a new child cell.

According to the present invention, there is provided another method of generating from design data defined on a multilayer cell structure exposure data necessary to form a pattern on a specimen with a charged beam or laser-beam exposure device, the method comprising the following steps of subjecting a hierarchical structure of the design data to an optimization process; and converting the design data into exposure data by subjecting the design data at each level of hierarchy to a specific shape data operation process intended for at least one layer, wherein the step of subjecting the hierarchical structure to the optimization process comprises the following substeps of determining an overlapping area of an array arrangement of a first cell and that of a second cell each of which is defined for reference once or more in a cell in the design data; generating a new cell having a unit length defined by a common multiple of an array repetition unit length of the first cell and that of the second cell, based on patterns of the first cell and that of the second cell in the over-lapping area; and replacing the array arrangement of the first cell and that of the second cell with the array arrangement of a third cell in which patterns originally belonging to the first or second cells exist.

According to the present invention, there is provided another method of generating from design data defined on a multilayer cell structure exposure data necessary to form a pattern on a specimen with a charged beam or laser-beam exposure device, the method comprising the following steps of subjecting a hierarchical structure of the design data to an optimization process; and converting the design data into the exposure data by subjecting the design data at each level of hierarchy to a specific shape data operation process intended for at least one layer, wherein the step of subjecting the hierarchical structure to the optimization process comprises the following substeps of determining an overlapping area of an array arrangement of a first cell and that of a second cell each of which is defined for reference once or more in a cell in the design data; generating a new cell by dividing and combining arrays based on information on the hierarchy of the design data so that circumscribed rectangles of cells may not overlap and may be repeated as many times as possible in the array arrangement overlapping area; and replacing the array of the first cell and that of the second cell in the overlapping area with the new cell.

According to the present invention, there is provided a device for converting design pattern data of a multilayer cell structure into exposure data for a two-stage-deflection charged beam exposure device with a main deflector and a sub-deflector, comprising means for changing a hierarchical structure of design data so as to enable a hierarchical shape data operation process suitable for the charged beam exposure device by subjecting the design data to a hierarchical optimization process including at least cell overlapping removal and resizing; means for subjecting the hierarchically optimized design data to a hierarchical shape data operation process including at least a tone reversal process, a mirror inversion process, a resizing process, and a trapezoidal division; means which compresses the design data subjected to the hierarchical shape data operation process and which checks a shape equal to or larger than a subfield size of all the shapes subjected to the shape data operation process to see whether the shape can be represented by repetition of unit cells of a rectangle of the subfield size, whether the shape can be represented by the repetition of a combination of unit cells and arbitrary cells of rectangles of arbitrary sizes, or whether the shape can be represented by repetition of arbitrary cells, and if the shape can be represented by one of these repetitions, changes the hierarchical structure of the cells; means for subjecting cells larger than the subfield size to a subfield division process; and means for sorting the cells into the individual frames.

With the exposure data generating method of the present invention, when exposure data is generated, the amount of exposure data can be compressed without increasing the time needed to convert the design data into the exposure data. This is achieved by performing the process of dividing a pattern larger than the size of a minimum subfield area into patterns equal to or smaller than the size of a subfield area and restructuring the hierarchy of cells before the pattern is divided during the generation of subfield exposure data. The same is also achieved by performing the process of extracting the same ones from the patterns in a cell and restructuring them in another cell before the generation of subfield exposure data.

Furthermore, with the present invention, the cell explosion leading to a decrease in the efficiency of the hierarchical shape data operation process is minimized by restructuring the overlapping arrays of cells into unoverlapping arrays of cells before the hierarchical optimization process. In addition, the exposure data is generated by exploding the arrays in the design data as little as possible. Therefore, the exposure data generating time and the amount of exposure data are decreased.

As a consequence, the time required to form a mask necessary for the manufacture of LSI is made shorter and a data storage device for a manufacturing machine is made smaller in size, which helps reduce manufacturing cost.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 11A, 11B, 11C, 11D and 11E are diagrams to help explain the change of the cell hierarchical structure in the third embodiment;

FIG. 22 shows the formats of design data;

FIGS. 30A, 30B and 30C illustrate a cell hierarchical structure to help explain the fifth embodiment;

FIGS. 41A, 41B and 41C illustrate the hierarchical structure of the design data processed in the sixth embodiment;

DETAILED DESCRIPTION OF THE INVENTION

A preferred embodiment of a method for generating exposure data for lithographic apparatus according to the present invention will now be described with reference to the accompanying drawings.

First Embodiment

Figure 1:
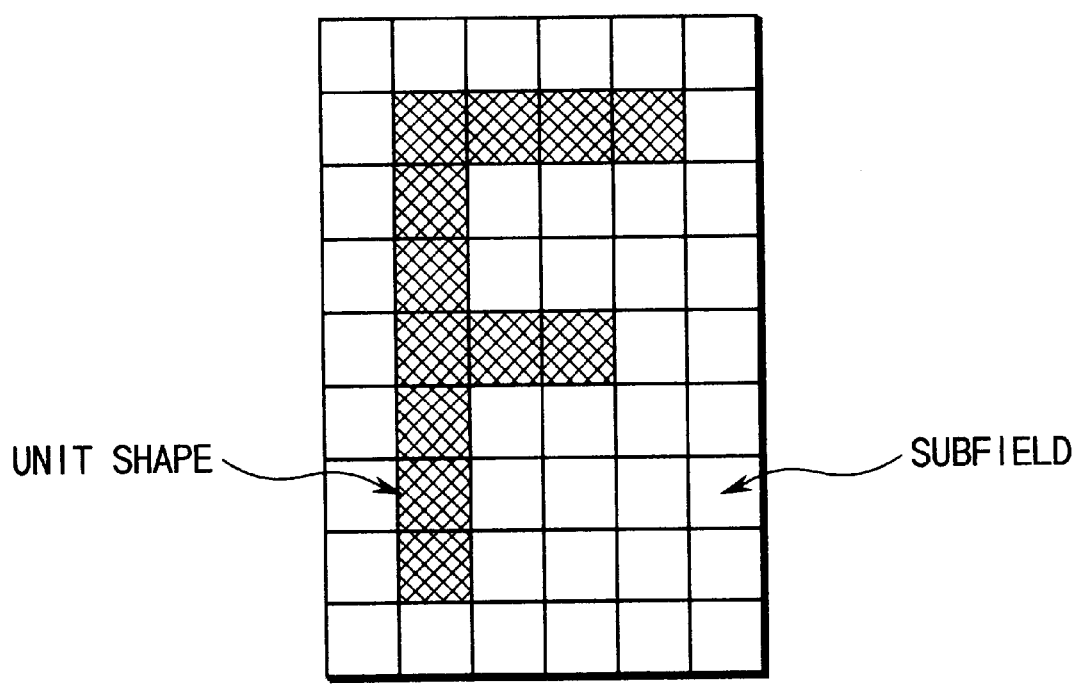
FIG. 1 is a diagram to help explain a conventional method of generating exposure data.
Figure 2:
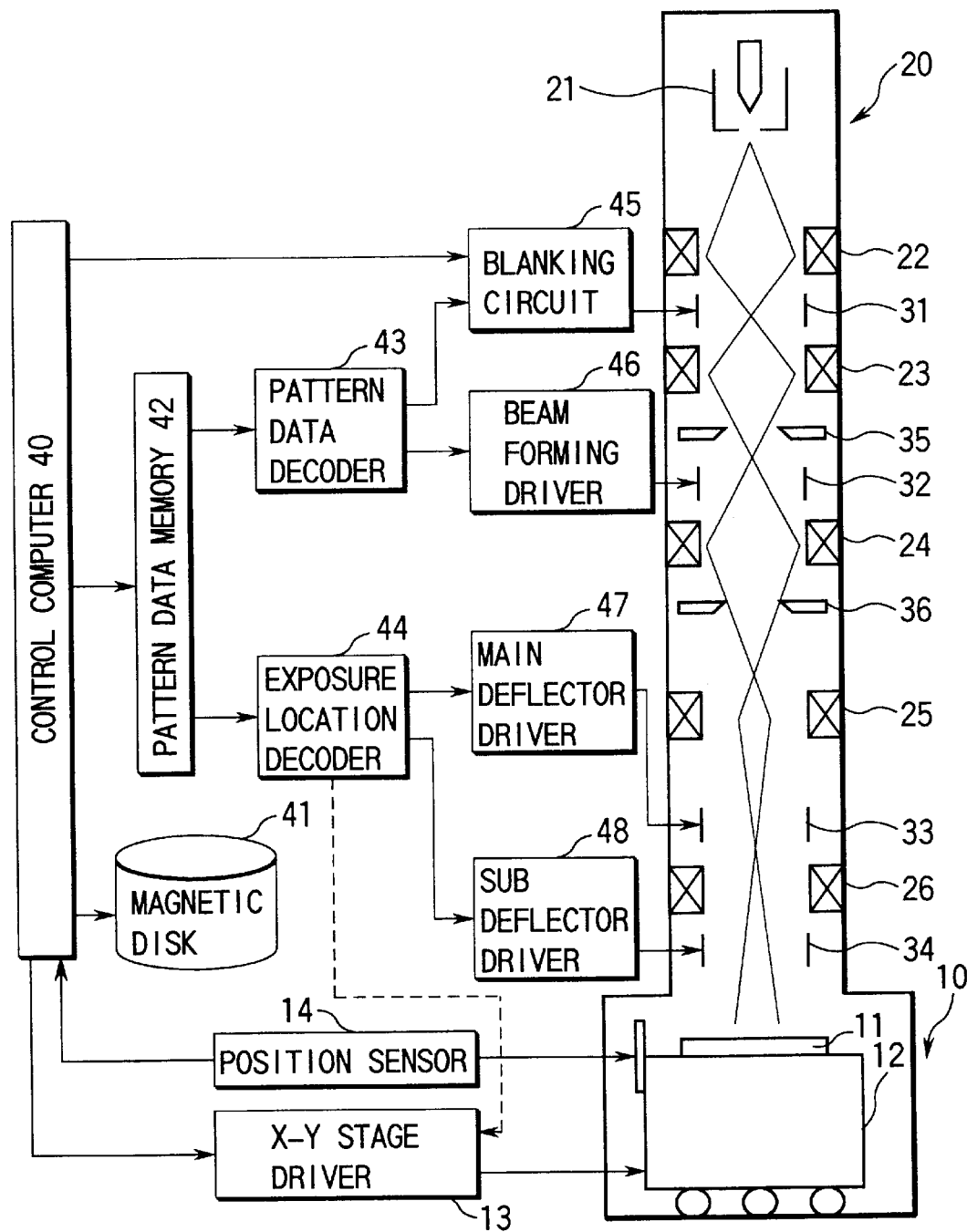
FIG. 2 schematically shows the configuration of an electron beam exposure device using exposure data generated by the present invention.

FIG. 2 schematically shows the configuration of an electron beam exposure device of the main-sub two-stage deflection type as an example of a charged beam exposure device. A specimen chamber 10 is provided at the bottom of the exposure device. In the specimen chamber 10, there is provided an X-Y stage 12 on which a specimen 11, such as a semiconductor wafer or a mask, is placed. The X-Y stage 12 is driven by an X-Y stage driving circuit 13 in the direction of X (or from side to side on the figure) and in the direction of Y (or from front to rear on the figure). The position of the X-Y stage 12 is measured by a position sensor 14 using a laser length measurement system.

On the specimen chamber 10, an electron beam optical system 20 integrally formed with the specimen chamber 10 is provided. The optical system 20 comprises an electron gun 21, various lenses (electro-static lenses) 22 to 26, a blanking deflector 31, a beam size varying deflector 32, a main deflector 33 for beam scanning, a sub-deflector 34 for beam scanning, and beam shaping apertures 35 and 36. The main deflector 33 positions an electron beam in a specific subfield scanning area (hereinafter, referred to as a subfield) and the sub-deflector 34 positions the electron beam for each shape which is obtained by the subfield division and has a size smaller than the maximum shot size. In parallel with these positioning actions, the frame area divided into rectangles according to the deflection width of the sub-deflection beam is exposed, while the beam size varying deflector 32 and beam shaping apertures 35 and 36 are controlling the shape of the beam and moving the X-Y stage 12 continuously in one direction. Additionally, the X-Y stage 12 is moved in steps in the direction perpendicular to the direction in which the X-Y stage 12 moves continuously. By repeating these processes, each frame area is exposed one by one.

Storage mediums, including a magnetic disk 41, are connected to a control computer 40. In the magnetic disk 41, LSI exposure data has been stored. The exposure data read from the magnetic disk 41 is temporarily stored for each frame area into a pattern memory 42 acting as a buffer. The pattern data for each frame area stored in the pattern memory 42, or frame information made up of exposure position and elementary pattern data, is analyzed by a pattern data decoder 43 and an exposure location decoder 44 constituting a data analysis section. The resulting data is sent to a blanking circuit 45, a beam shaper driver 46, a main deflector driver 47, and a sub-deflector driver 48.

Specifically, the pattern data decoder 43 divides the elementary pattern data defined in the frame data into elementary shot shape groups that can be formed by a combination of the shaping apertures 35 and 36. Based on this data, blanking data is generated and sent to the blanking circuit 45. Then, the desired beam size data is generated and sent to the beam shaper driver 46. Next, the beam shaper driver 46 sends a specific deflection signal to the beam size varying deflector 32 of the optical system 20, which controls the size of the electron beam.

On the basis of the frame data, the exposure location decoder 44 generates data for positioning subfields and sends the data to the main deflector driver 47. Then, the main deflector driver 47 sends a specific signal to the main deflector 33 of the optical system 20, which causes the electron beam to be deflected to the position of a specified subfield. The exposure location decoder 44 further generates a sub-deflector scanning control signal and sends the signal to the sub-deflector driver 48. Then, the sub-deflector driver 48 sends a specific sub-deflection signal to the sub-deflector 34, which enables writing to be effected subfield by subfield.

Figure 3:
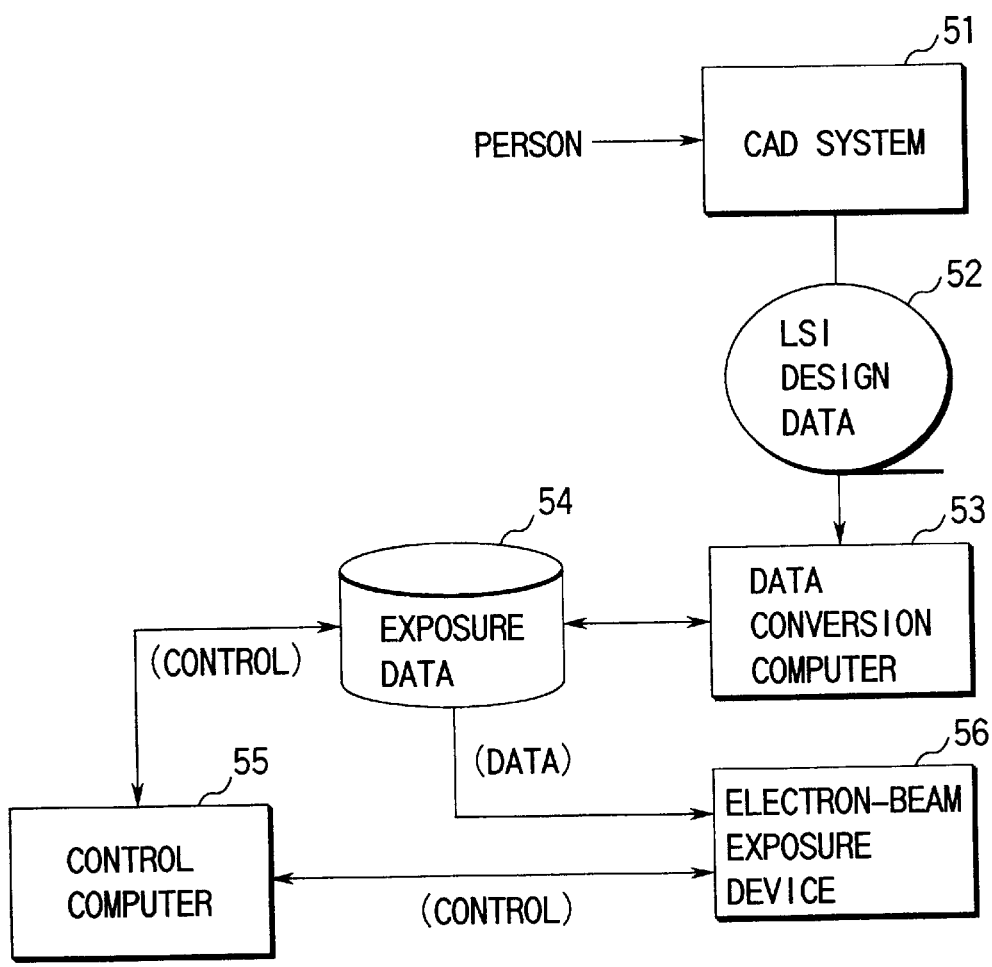
FIG. 3 shows the flow of data related to the exposure device of FIG. 2.

FIG. 3 schematically shows a first embodiment of an exposure data generating method of the present invention in which exposure data supplied to the exposure device is generated by converting design data. An LSI pattern is generated by a CAD system 51. The design data 52 outputted from the CAD system is converted by a data conversion computer 53 into exposure data 54. Then, after a control computer 55 has read the exposure data 54, an electron beam exposure device performs an exposure process.

Figure 4:
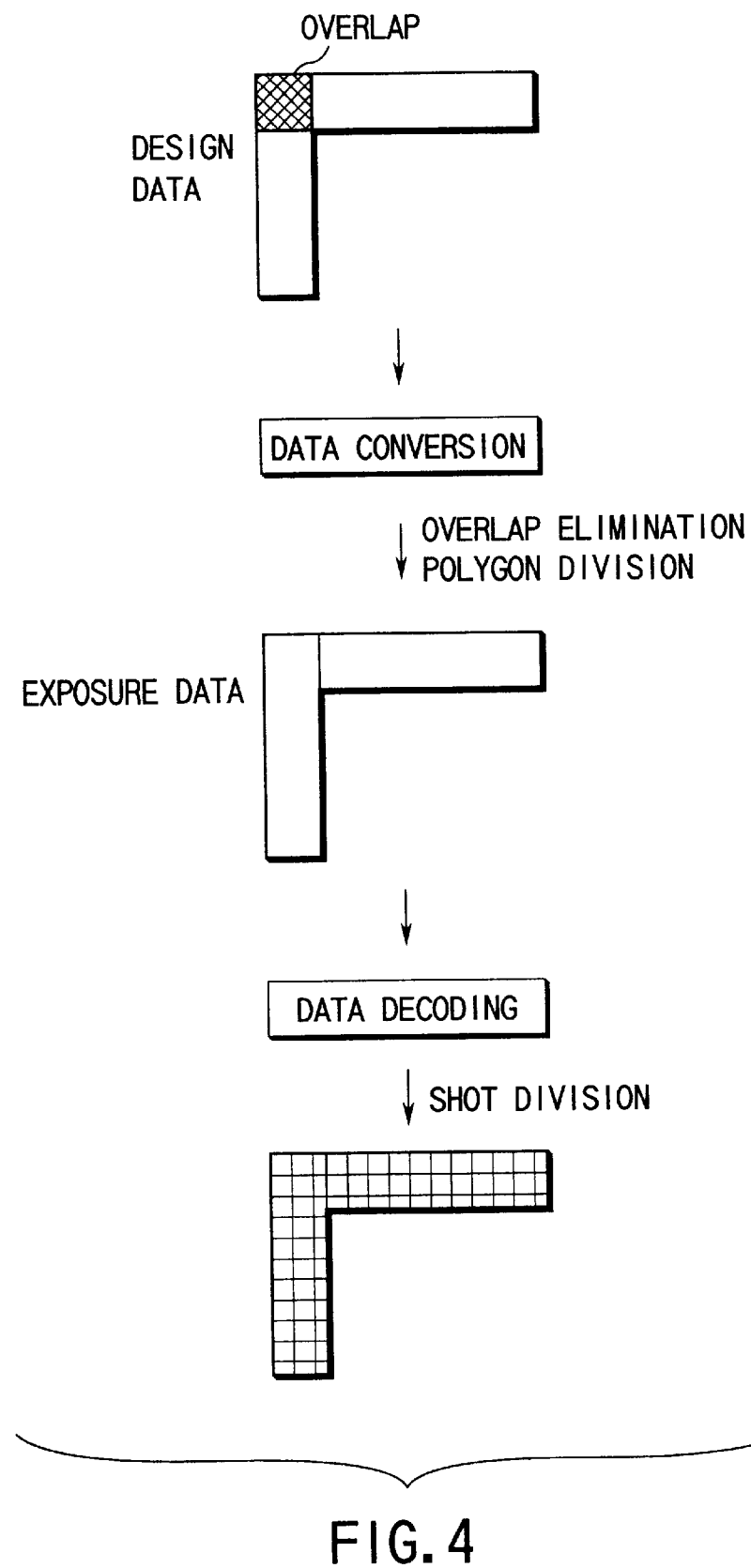
FIG. 4 schematically shows the steps of generating exposure data.

FIG. 4 shows how the design data is converted by a data conversion process via such processes as the removal of pattern overlaps and the division of trapezoids into exposure data acceptable to the electron beam exposure device and how the pattern data decoder 43 of the exposure device divides the exposure data into rectangles or triangles that the exposure device can expose.

Figure 5:
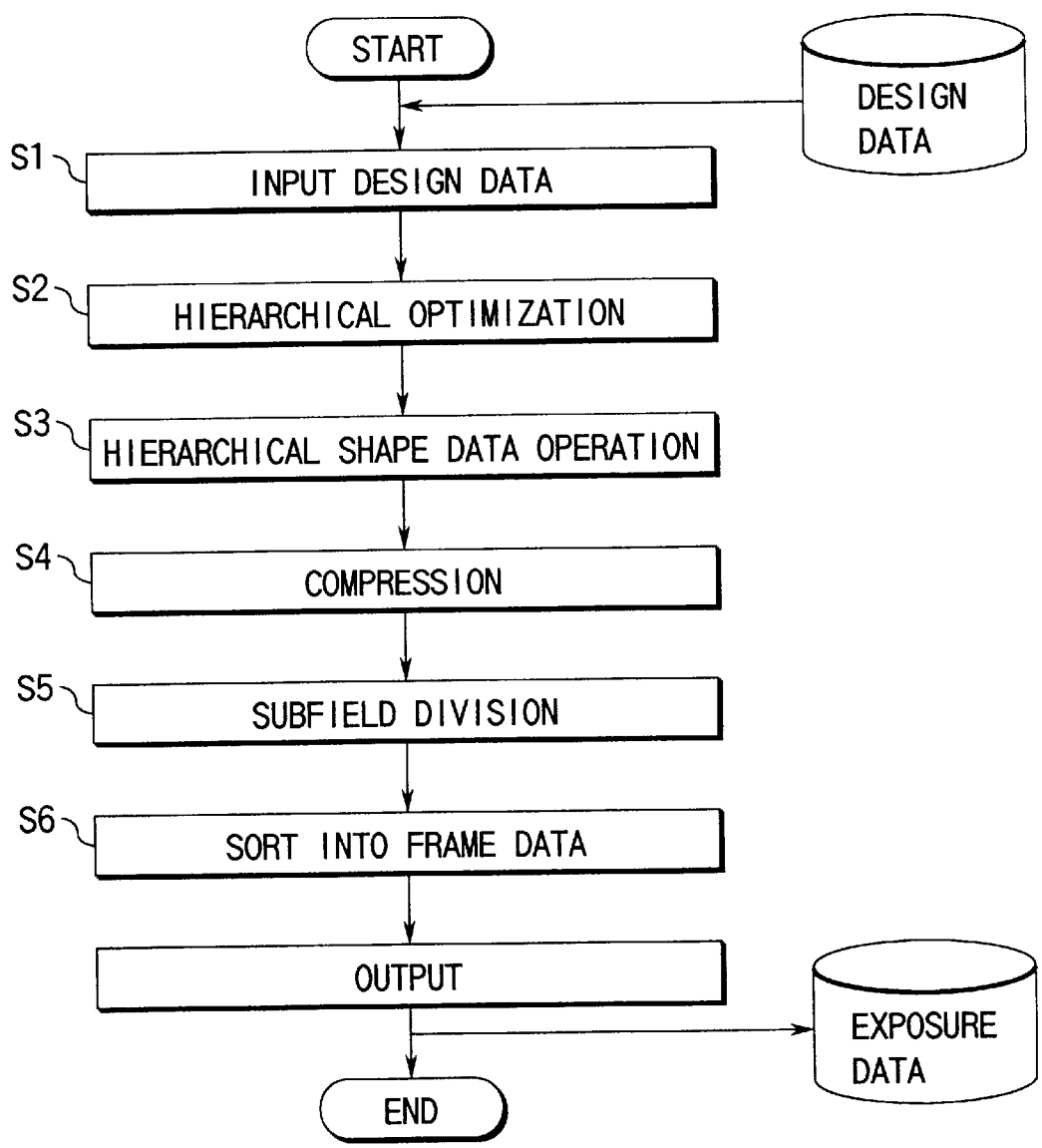
FIG. 5 is a flowchart for a method of generating exposure data according to a first embodiment of the present invention.

Hereinafter, a method of generating electron beam exposure data according to the first embodiment will be explained in detail. FIG. 5 is a flowchart for the process of converting LSI design data into exposure data acceptable to the exposure device.

At step S1, design data of a multilayer cell structure is inputted.

At step S2, a hierarchical optimization process including removal of cell overlaps and preprocess for resizing (doughnut process) are performed on the inputted design data to change the hierarchical structure of the design data so that a hierarchical shape data operation process suitable for the electron beam exposure device may be carried out.

At step S3, the hierarchical shape data operation process is performed on the design data subjected to hierarchical optimization at step S2. The shape data operation includes, for example, tone reversal process, a mirror inversion process, and a resizing process. When only trapezoids are allowed to be inputted as patterns to the exposure device, the trapezoidal division of patterns is made at this step.

At step S4, the data is compressed. In the compression process, the following judgments are made for all the shapes subjected to the shape data operation: whether the shapes larger than the size of a subfield can be represented by the repetition of cells of a rectangle of the subfield size (hereinafter, referred to as unit cells), whether the shapes can be represented by the repetition of a combination of unit cells and cells of rectangles of arbitrary sizes (hereinafter, referred to as arbitrary cells), or whether the shapes can be represented by the repetition of arbitrary cells. If the shapes can be represented by one of these repetitions, the hierarchical structure of cells will be changed.

At step S5, cells larger than the subfield size are subjected to a subfield division process.

At step S6, the cells are sorted into the individual frames, which completes the generation of the exposure data.

The compression process at step S4 will be further explained by reference to FIGS. 6A to 6F and FIG. 7.

Figure 6A:
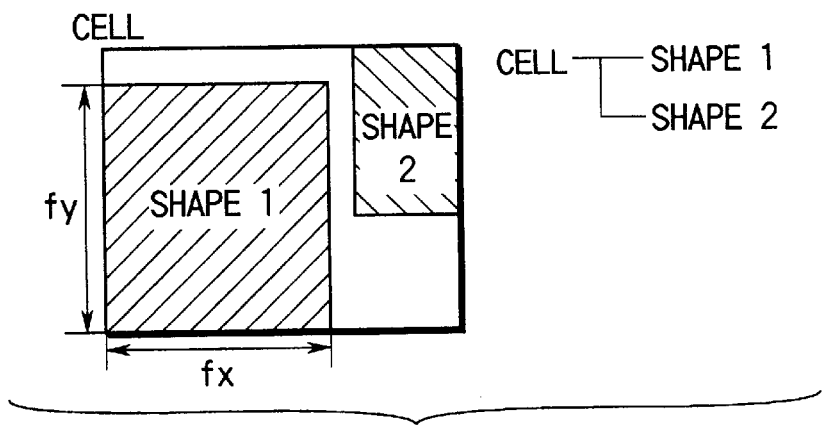
FIGS. 6A, 6B, 6C, 6D, 6E and 6F are diagrams to help explain the change of the cell hierarchical structure in the first embodiment.

The cell in FIG. 6A is a cell subjected to the shape data operation process at step S3. Shape 1 and shape 2 are included in the cell of FIG. 6A. It is assumed that at least either the size of shape 1 or that of shape 2 (in this case, the size (fx, fy) of shape 1) is larger than the unit cell and/or the subfield size represented by the repetition of arbitrary cells.

Figure 6B:
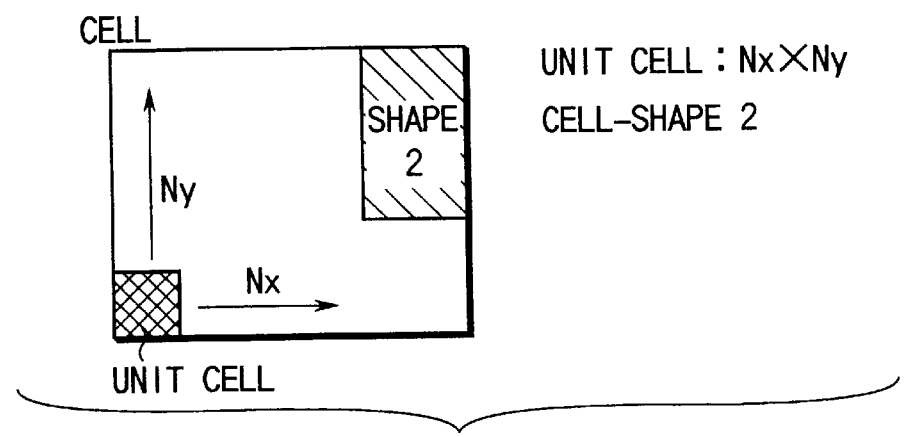
Figure 6C:
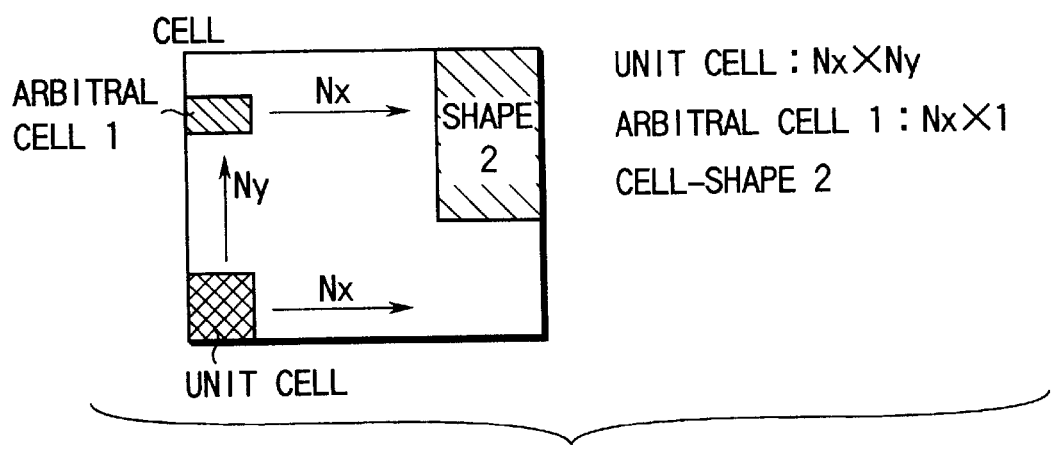
Figure 6D:
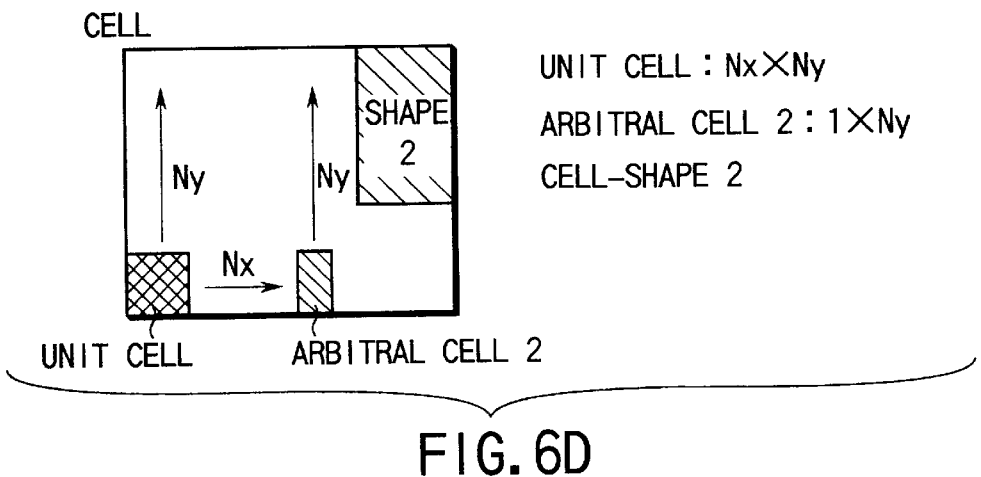
Figure 6E:
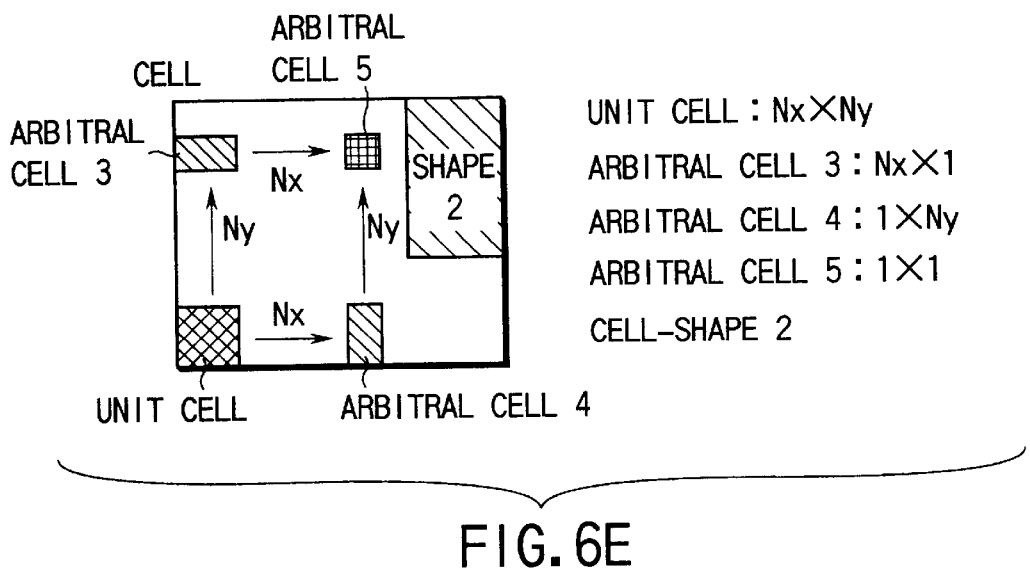
Figure 7:
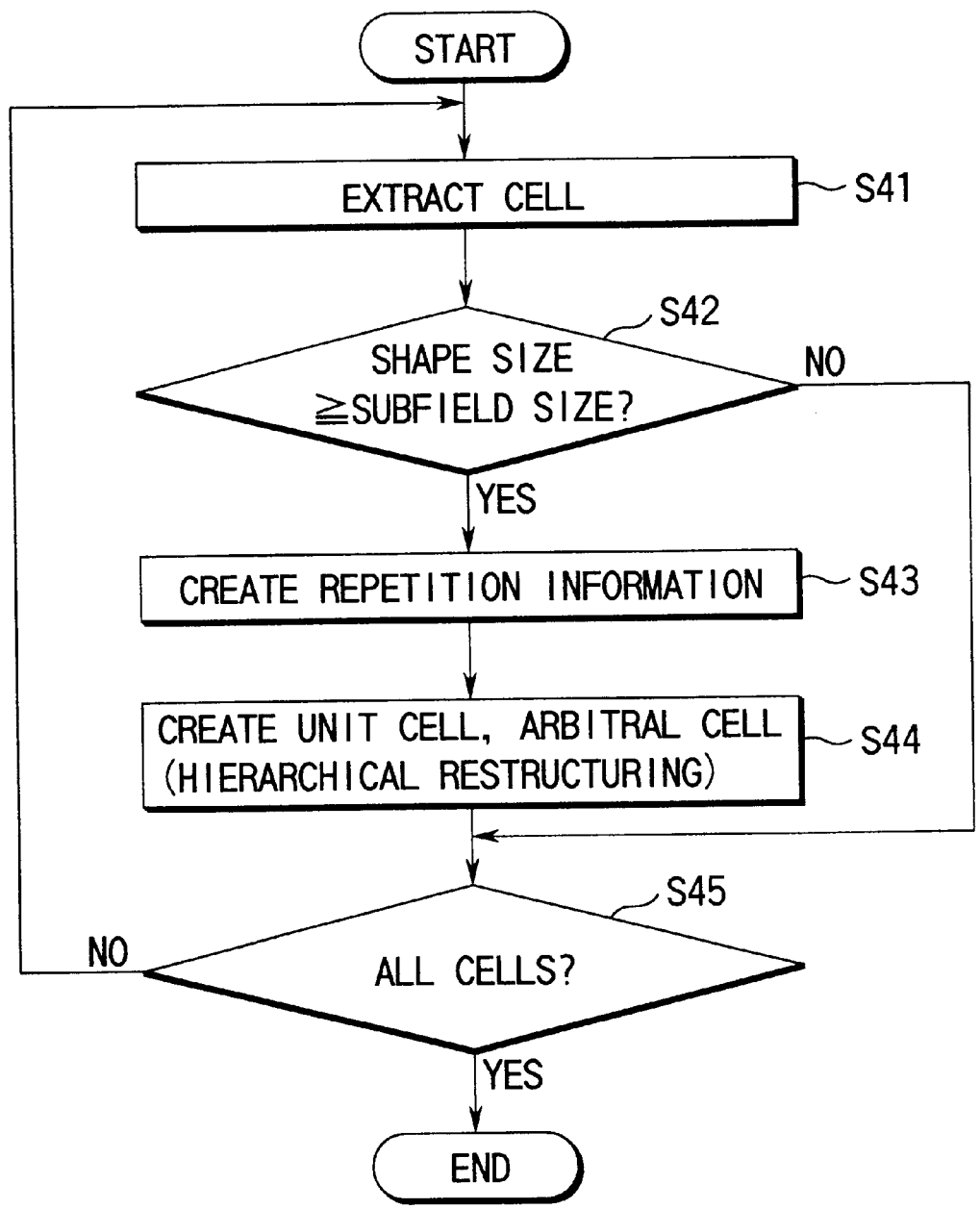
FIG. 7 is a detailed flowchart for the compression process in the first embodiment.

FIG. 7 is a detailed flowchart for the compression process at step S4 of FIG. 5. With the compression process, the cell of FIG. 6A is represented by any one of FIG. 6B to FIG. 6E, thereby changing the hierarchical structure of the cell.

At step S41, the cell subjected to the hierarchical shape data operation is extracted.

At step S42, comparison is made to see whether or not the size (fx, fy) of the shape included in the cell is larger than the subfield size.

If there are no shapes which are greater than or equal to the subfield size in the extracted cell, step S45 will be executed immediately. If there is a shape larger than or equal to the subfield size, following repetition information will be created from the shape size and the subfield size (sfs):

fx/sfs=Nx with Rx, where Nx is the quotient (an integer) and Rx is the remainder (an integer)

fy/sfs=Ny with Ry, where Ny is the quotient (an integer) and Ry is the remainder (an integer)

fx/(Nx+1)=Gx fy/(Ny+1)=Gy fx/Gx=NxG fy/Gy=NyG

At step S44, the hierarchical structure of the cell is changed and unit cells and arbitrary cells are generated.

The hierarchical structure of the cell in FIG. 6A is changed according to the following conditions:

(i) If Rx=0 and Ry=0, shape 1 will be represented by an Nx×Ny array of unit cells (of a cell size of sfs×sfs) (see FIG. 6B)

(ii) If Rx=0 and Ry≠0, shape 1 will be represented by an Nx×Ny array of unit cells and an Nx×1 array of arbitrary cells 1 (of a cell size of sfs×Ry) (see FIG. 6C)

(iii) If Rx≠0 and Ry=0, shape 1 will be represented by an Nx×Ny array of unit cells and a 1×Ny array of arbitrary cells 2 (of a cell size of Rx×sfs) (see FIG. 6D)

(vi) If Rx≠0 and Ry≠0, shape 1 will be represented by an Nx×Ny array of unit cells, an Nx×1 array of arbitrary cells 3 (of a cell size of sfs×Ry), a 1×Ny array of arbitrary cells 4 (of a cell size of Rx×sfs), and a 1×1 array of arbitrary cells 5 (of a cell size of Rx×Ry) (see FIG. 6E).

Figure 6F:
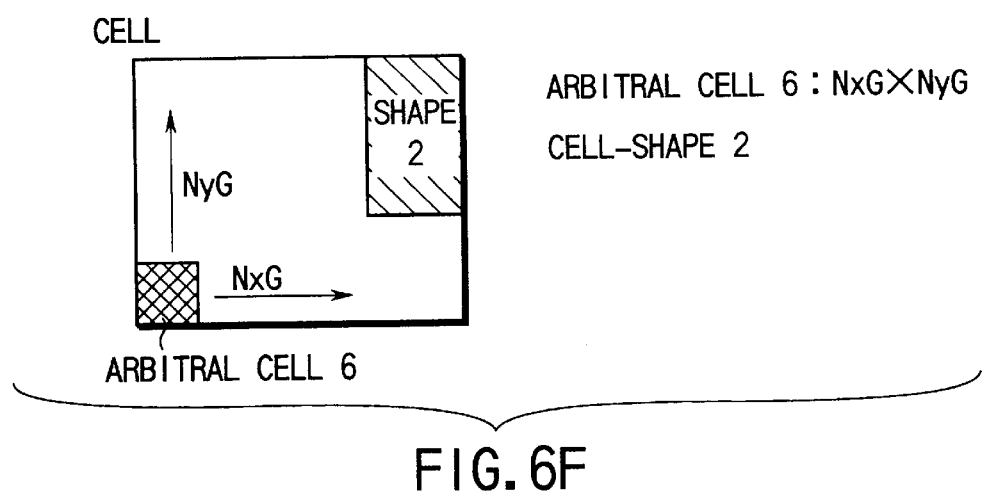

(v) If the cell is to be represented using only arbitrary cells, shape 1 will be represented by an NxG×NyG of arbitrary cells 6 (of a cell size of Gx×Gy) (see FIG. 6F).

For shape 2, too, if its size (fx, fy) is larger than or equal to the subfield size, it will be processed as shape 1 is.

Thereafter, at step S45, it is determined whether or not the processes have been completed for all of the cells. The cell extraction at step S41 is executed repeatedly until the processes have been completed for all of the cells.

As described above, with the first embodiment, before the subfield exposure data is generated, it is determined whether or not the size of shapes included in the cell is larger than the minimum subfield area size. If it is larger than the latter, the shape will be divided into patterns equal to or smaller than the subfield area size and be restructured. This prevents a shape larger than the subfield area size from being divided during the generation of subfield data, which makes it possible to create exposure data with a decreased amount of data without increasing the time required to convert the design data into the exposure data.

In the prior-art processing, a shape was divided into subfield areas. Then, unit shapes were generated and information on their arrangement was acquired for compression. With this approach, however, unit shapes were generated only in subfields and the odd portions of the unit shape were not compressed.

With the first embodiment, the utilization of cells of arbitrary rectangles (arbitrary cells) to the odd portions of a unit shape enables a shape unable to be compressed in the prior art to be compressed. Use of repetition information reduces the amount of information on the arrangement more than in the prior art.

In the prior-art processing, the compression process was performed after the subfield division. The pattern matching process had to be performed on each of the shapes obtained by dividing the original shape into subfields, leading to an increase in the data conversion time.

With the first embodiment, however, unit shapes are compressed before the subfield division. This enables the subfield division process to be performed on the unit cells and arbitrary cells, which shortens the data conversion time remarkably as compared with the prior-art processing.

For example, if the above method is applied to the design data including many repetitive patterns or the design data including a large figure, the amount of exposure data can be reduced to ½ to ¹⁄₁₆ of the amount of data in the prior-art method.

Hereinafter, other embodiments of the present invention will be explained. In the embodiments below, the parts corresponding to those in the first embodiment are indicated by the same reference numerals and a detailed explanation of them will be omitted.

Second Embodiment

A second embodiment of the present invention will be explained by reference to a flowchart in FIG. 8 and conceptual diagrams of cells in FIGS. 9A and 9B.

Figure 8:
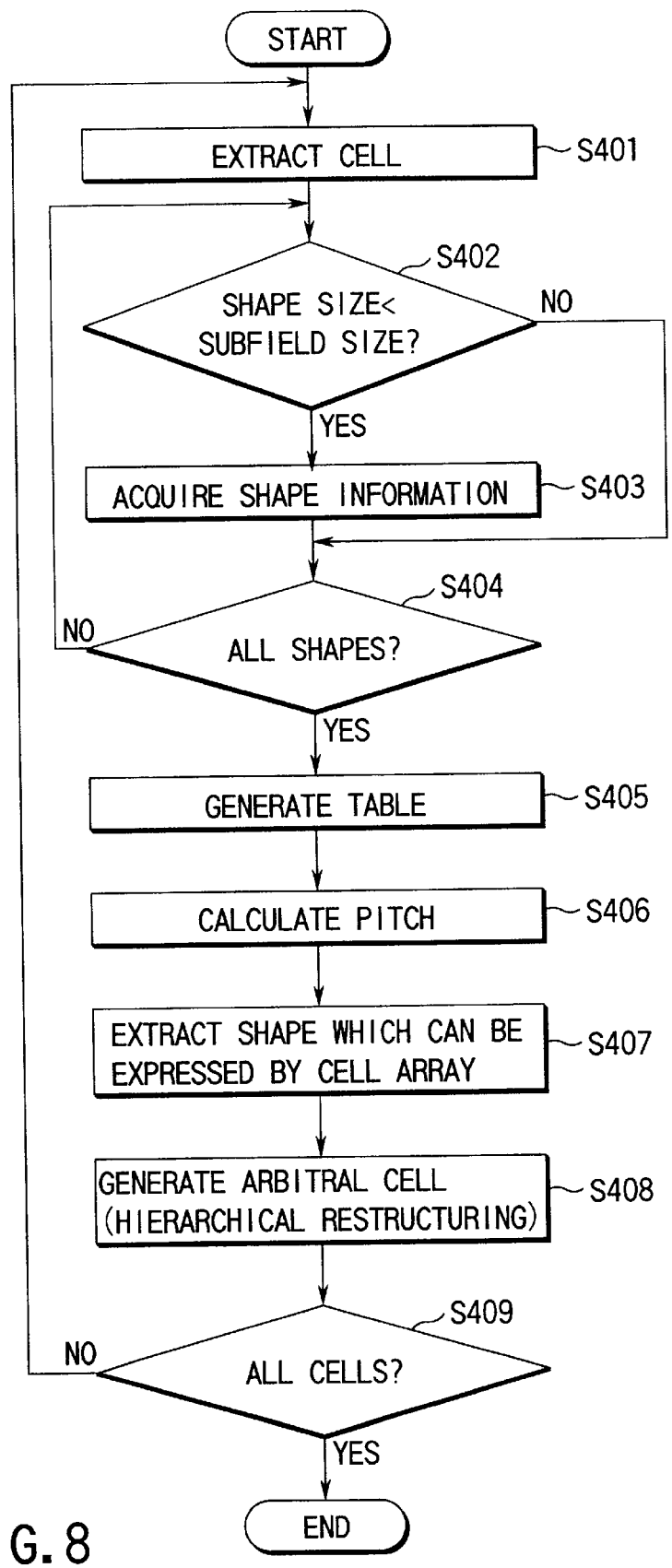
FIG. 8 is a detailed flowchart for the compression process in a second embodiment of the present invention.

FIG. 8 is a detailed flowchart for the compression process in step S4. By the compression process, the hierarchical structure of a cell in FIG. 9A is changed as shown in FIG. 9B. In the cell of FIG. 9A, shapes 1 to 17 are congruence. Shapes 18 and 19 are congruence. Shapes 20 and 21 are congruence. The x-coordinates of the origins of the shapes 1 to 3 and 18 to 20 are the same. The x-coordinates of the origins of the shapes 4 and 5 are the same. The x-coordinates of the origins of the shapes 6 to 8 are the same. The x-coordinates of the origins of the shapes 9 and 10 are the same. The x-coordinates of the origins of the shapes 11 to 13 are the same. The x-coordinates of the origins of the shapes 14 to 17 are the same. The y-coordinates of the origins of the shapes 1, 6 and 11 are the same. The y-coordinates of the origins of the shapes 2, 7 and 12 are the same. The y-coordinates of the origins of the shapes 3, 8 and 13 are the same. The pitch between the shapes 1 and 2 in y-direction and the pitch between the shapes 2 and 3 in y-direction are the same. The pitch between the shapes 6 and 7 in y-direction and the pitch between the shapes 7 and 8 in y-direction are the same. The pitch between the shapes 11 and 12 in y-direction and the pitch between the shapes 12 and 13 in y-direction are the same. The pitch between the shapes 14 and 16 in y-direction and the pitch between the shapes 16 and 17 in y-direction are the same. The pitch between the shapes 1 and 6 in x-direction and the pitch between the shapes 6 and 11 in x-direction are the same.

At step S401, the cell subjected to hierarchical shape data operation is extracted.

At step S402, it is determined whether or not the size (fx, fy) of the shape included in the cell is smaller than the subfield size.

If it is not smaller than the subfield size, step S404 will be executed immediately. If it is smaller than the subfield size, shape information such as the shape, size, the coordinates of the origin is acquired at step S403.

At step S404, it is determined whether or not all the shapes in the extracted cell are processed.

At step S405, a table is generated for the same shape and the same size.

At step S406, congruence shapes having the same x-coordinates are divided into groups and the pitch of the shapes in the y-direction is calculated for each group. For example, group A is formed of the shapes 1 to 3, group B is formed of the shapes 18 and 19, group C is formed of the shapes 4 and 5, group D is formed of the shapes 6 to 8, group E is formed of the shapes 9 and 10, group F is formed of the shapes 11 to 13, group G is formed of the shapes 14 to 17, group H is formed of the shape 20, group I is formed of the shape 21, and group J is formed of the shape 22. For the group A, the pitch py12 between the shapes 1 and 2, the pitch py13 between the shapes 1 and 3 and the pitch py23 between the shapes 2 and 3 are calculated.

At step S407, shapes which can be represented by repetition (cell arrays) are extracted. More detail, the shapes having the same pitches in the y-direction for each group are defined as one-dimensional array in the y-direction. For the group A, since py12=py23, the shapes 1 to 3 are represented by a y-directional array of 1×3. Similarly, for the group D, the shapes 6 to 8 are represented by a y-directional array of 1×3. For the group F, the shapes 11 to 13 are represented by a y-directional array of 1×3. For the group G, the shapes 14 to 17 are represented by a y-directional array of 1×3. If the number of shapes in the group is two, these shapes are unconditionally represented by a y-directional array. For example, for the group B, the shapes 18 and 19 are represented by a y-directional array of 1×2. For the group C, the shapes 4 and 5 are represented by a y-directional array of 1×2. For the group E, the shapes 9 and 10 are represented by a y-directional array of 1×2.

If there are two arrays which are congruence but belong to the different groups, the pitch in the x-direction is calculated for the arrays of which the number of repetitions in the y-direction and the pitch in the y-direction are the same. If there are arrays having the same pitch in the x-direction, these arrays are reconstructed as two-dimensional array. For example, the group A (shapes 1 to 3), group D (shapes 6 to 8) and group F (shapes 11 to 13) are grouped into a two-dimensional array of 3×3.

If the number of shapes in the group is one, a pitch in the x-direction between that shape and a congruence shape having the same y-coordinate of the origin is calculated. If the pitch is the same or there are only two congruence shapes, they can be represented by one-dimensional array in the x-direction. For example, the group H (shape 20) and group I (shape 21) can be represented by one-dimensional array of 2×1 in the x-direction.

The above array expression is a mere example and conventional plural expressions can be used.

Figure 9A:
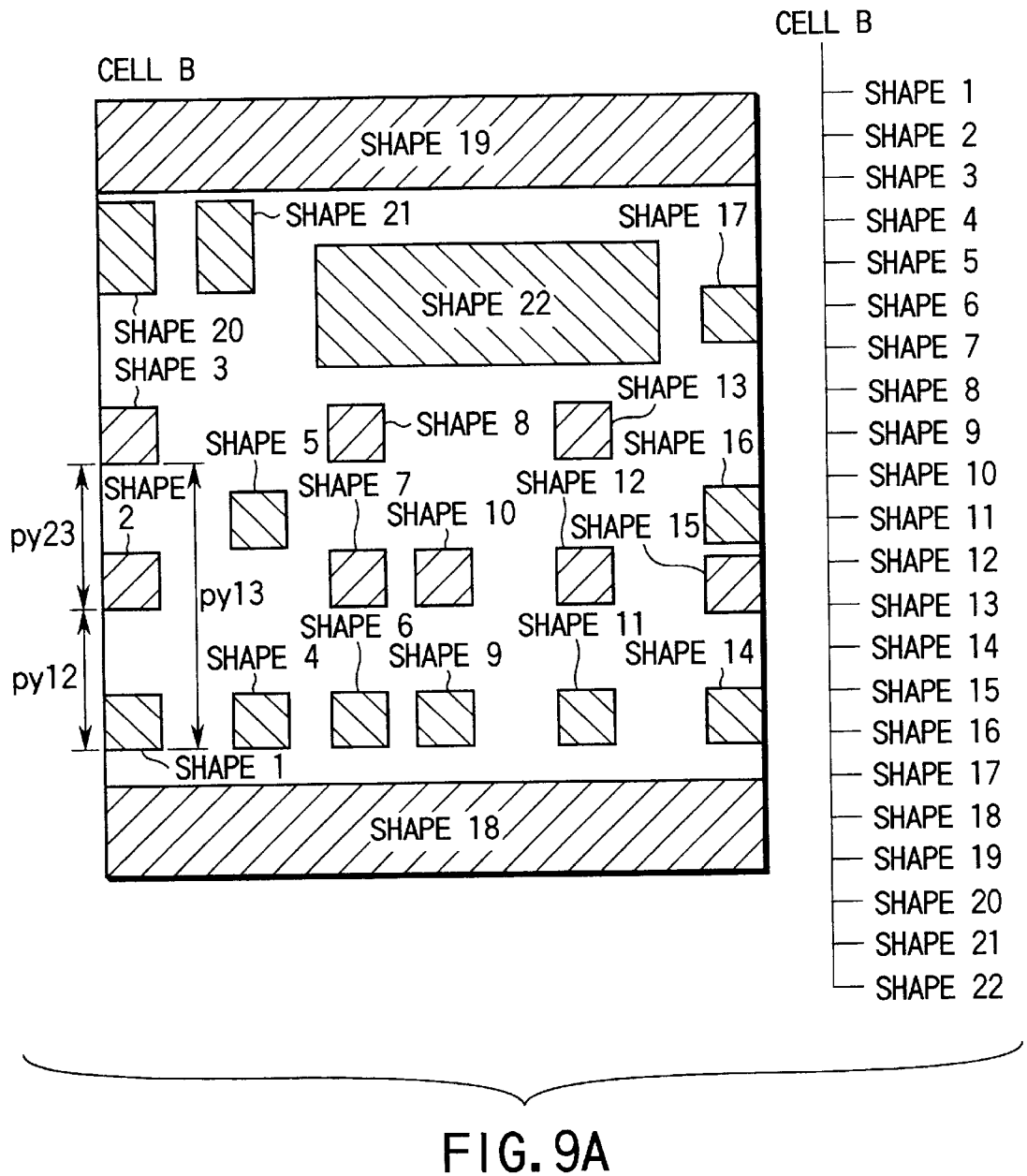
FIGS. 9A and 9B are diagrams to help explain the change of the cell hierarchical structure in the second embodiment.
Figure 9B:
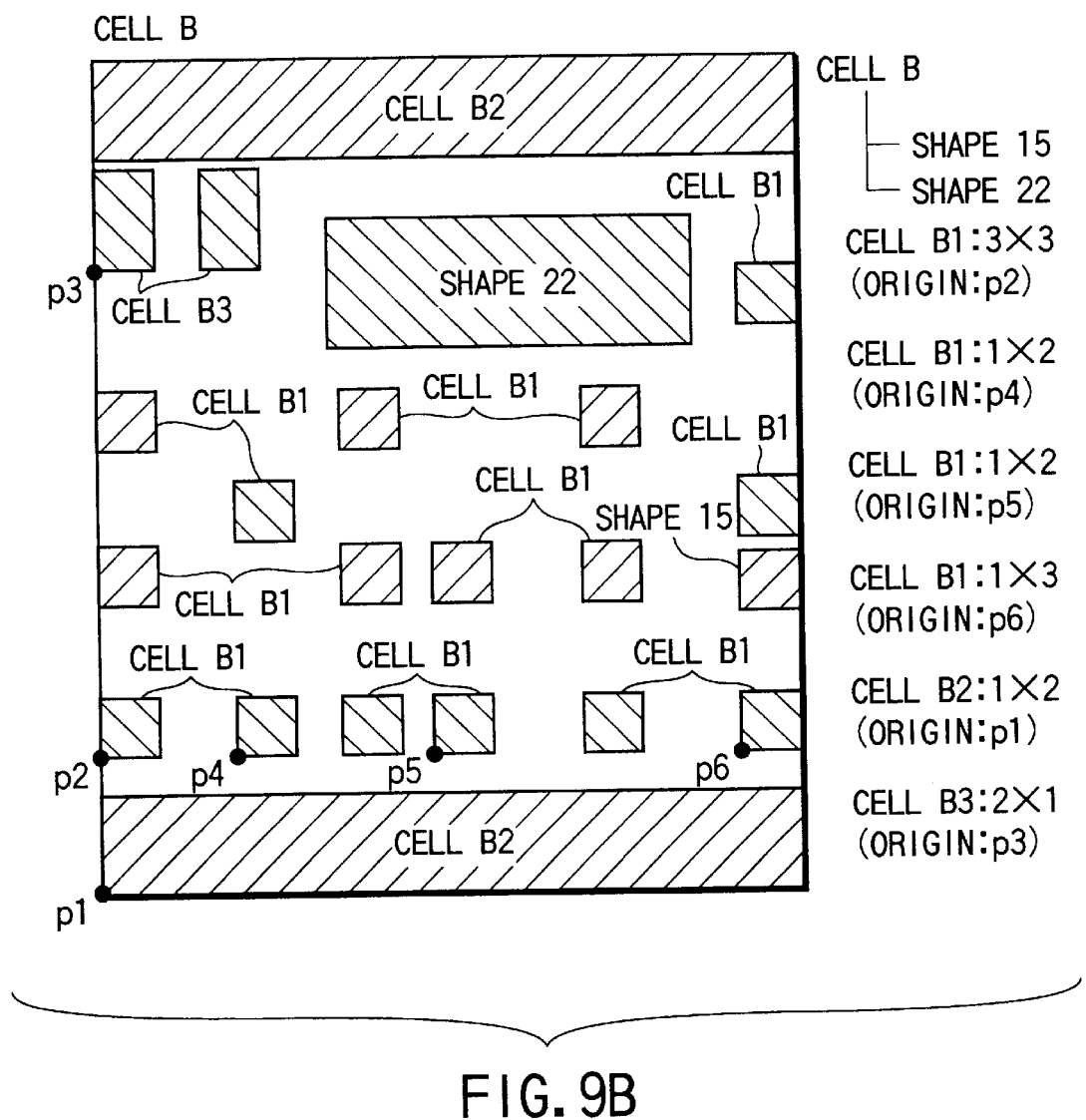

At step S408, the hierarchical structure of the cell in FIG. 9A is changed as shown in FIG. 9B. At this step, the cell which can be represented by an array is changed to an arbitral cell having the same shape and the cell which cannot be represented by an array remains in the cell. In FIG. 9B, the shapes other than the shapes 15 and 22 are represented by arbitral cells and the shapes 15 and 22 remain in the cell B.

At step S409, it is determined whether or not all the cells are extracted. If there is a cell which has not been extracted, the step S401 is repeated and the subsequent processes are executed. If all the cells have been extracted, the procedure is ended.

With the second embodiment, too, the utilization of cells of arbitrary rectangles (arbitrary cells) with respect to the odd portions of the shape makes it possible to compress a shape unable to be compressed in the prior art. Furthermore, use of repetition information reduces the amount of information on the arrangement more than in the prior art.

With the second embodiment, unit shapes are compressed before the subfield division. This enables the subfield division process to be performed on the unit cells and arbitrary cells, which shortens the data conversion time remarkably as compared with the prior-art processing.

Third Embodiment

The first and second embodiments are related to the compression process shown in FIG. 5. An embodiment related to the hierarchical optimization process will be explained.

Figure 10:
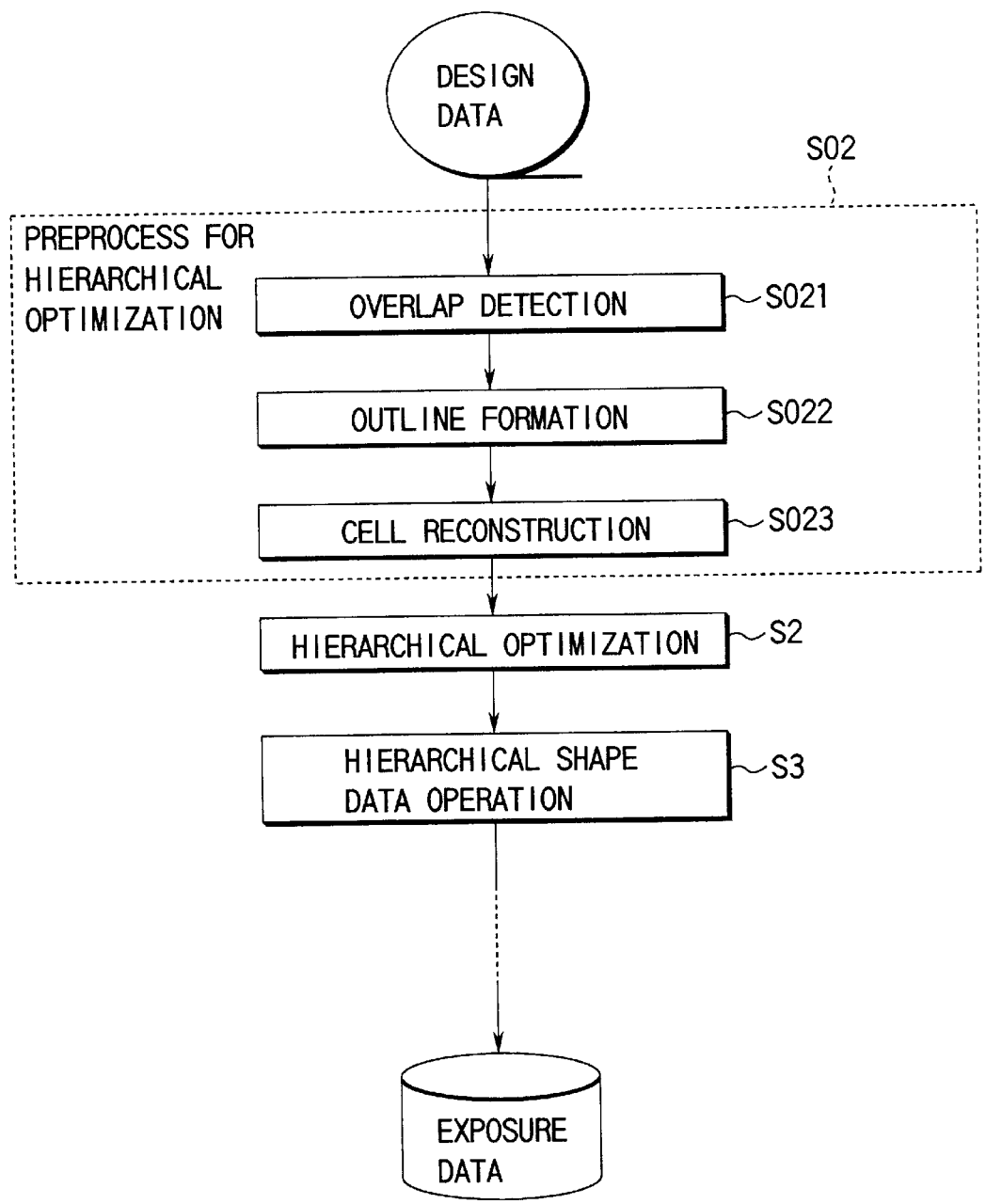
FIG. 10 is a flowchart for a preprocess for the hierarchical optimization process in a third embodiment of the present invention.

FIG. 10 is a detailed flowchart for the hierarchical optimization process in the third embodiment. The third embodiment is realized by the preprocess S02 of the ordinary hierarchical optimization process (e.g., a doughnut process) shown in FIG. 5.

First, the root cell of the inputted design data is selected and determined to be a parent cell. The cells defined for reference in the parent cell (hereinafter, referred to as child cells) are subjected one by one to the preprocess shown in FIG. 10.

At a first step S021, child cells which are completely covered with a shape belonging to the parent cell is found. If there is a child cell partially overlapping with the shape in the parent cell, the child cell will be exploded into the parent cell.

At a second step S022, an outline frame used to move the shape in the parent cell into the child cell is formed in the area.

At a third step S023, the shape in the parent cell existing in the formed outline frame is deleted from the parent cell. At the same time, when a child cell is in independent arrangement, the deleted shape is added into the child cell and the resulting cell is registered as a new child cell. When the child cell is in an array arrangement, the part of the shape deleted from the parent cell, or the rectangular portion defined by an array repetitive unit length in the directions of x and y of the child cell, is added into the child cell and the resulting cell is registered as a new child cell.

The above-described processing is performed on the cells in all of the layers of the design data. Specifically, the processing is repeated, starting from the highest level in the hierarchy of input CAD data level after another, until the cell in the lowest level has been reached. Conversely, the processing may be repeated, starting from the lowest level upward one level after another in the hierarchy, until the cell in the highest level, that is the root cell, has been reached.

After the hierarchical structure of the design data has been changed by the preprocess, the ordinary hierarchical optimization process (at step S2 of FIG. 5), such as a doughnut process, disclosed in reference 1 is carried out. Then, shape data operations, such as resizing, are performed. Finally, a formatting process conforming to the format for the electron beam exposure device is performed, which completes the data conversion process for the electron beam exposure device.

Next, an example of applying the third embodiment to the design data of FIG. 11A will be explained. In parallel with explanation of the design data, the structure of ordinary design data will be explained briefly.

As shown in FIG. 11A, the design data has a three-level hierarchy of cells. In the design data, a cell can generally have information on a shape belonging to the cell itself and/or on the arrangement of another cell for reference (instance information). The shape information is defined on several layers belonging to the cell.

Cell A in the highest level has two shapes Pa and Pa' as shown in FIG. 11B. The shapes are defined on layer 1 (the shaded portion with lines going from top right to bottom left). In cell A, a 4×4 array arrangement for cell B and cell C are defined as instance information. Cell B has shape Pb as shown in FIG. 11C. This shape is defined in layer 2 (the shaded portion with lines going from top left to bottom right). In cell B, another cell has not been arranged for reference. Namely, cell B has no instance information. Cell C has four shapes Pc as shapes belonging to cell C as shown in FIG. 11D. These shapes Pc are defined on layer 1. Moreover, cell C has a 4×4 array arrangement of cell D as instance information. The cell D has shape Pd as a shape belonging to itself as shown FIG. 11E. The shape Pd is defined on layer 2.

Figure 12:
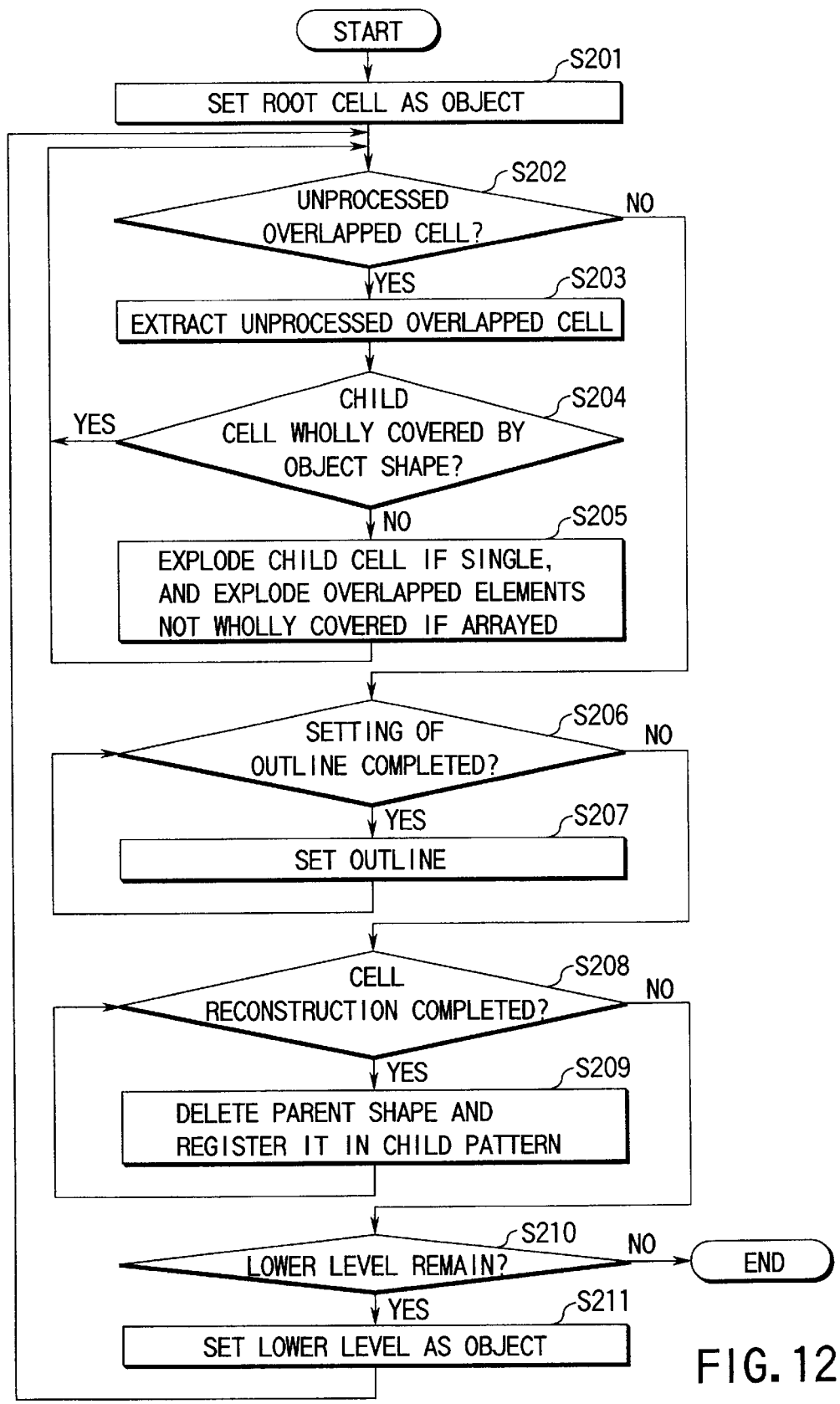
FIG. 12 is a detailed flowchart for the preprocess of the hierarchical optimization process in the third embodiment.

A case where the third embodiment is applied to this design data will be described by reference to FIG. 12 showing a detailed flowchart for the preprocess of FIG. 10 and to FIG. 13A, FIG. 13B, FIG. 14, and FIGS. 15A to 15D schematically showing the hierarchical structure of a cell.

At step S201, a cell in the highest level (the root cell) is determined to be an object of processing.

At step S202, it is determined whether or not there is any unprocessed overlapping area. If there is an overlapping area, control will proceed to step S203.

At step S203, an unprocessed overlapping area is extracted. It is assumed that the array arrangement of a cell overlapping with the shape Pa of the target cell (cell A) is determined to be an overlapping area. The overlapping area is extracted.

At step S204, it is determined whether or not the child cell is covered completely with the shape of the target cell. Because the whole area of the array arrangement of cell B is covered completely with shape Pa, control skips step S205 and returns to step S202. The hierarchical structure of the cell at this stage remains unchanged from FIG. 11A.

Next, at step S203, cell C overlapping with shape Pa' is selected as an overlapping portion.

Because the judgment at step S204 has shown that cell C is not covered completely with shape Pa', control goes to step S205.

Figures 13A, 13B:
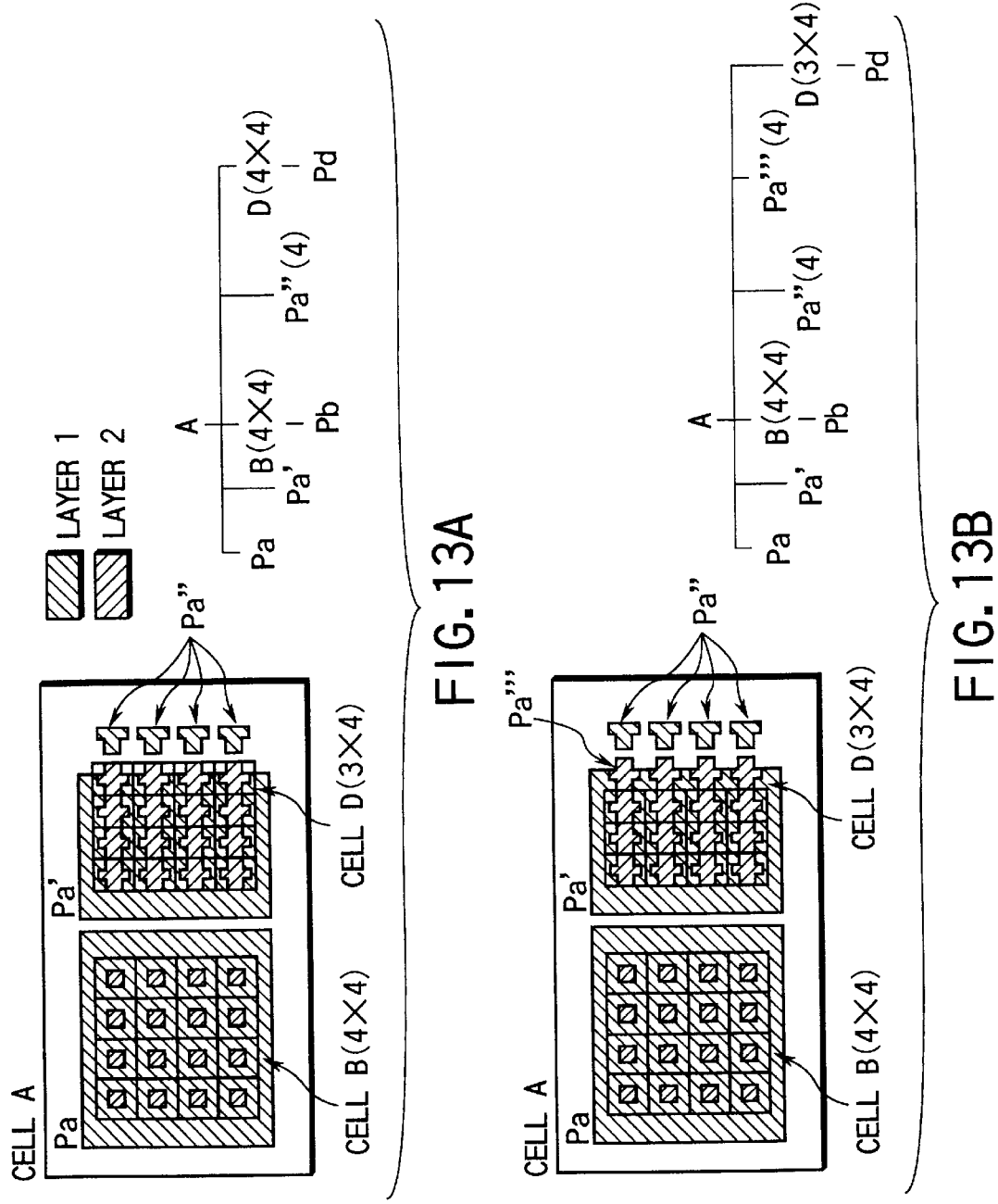
FIGS. 13A and 13B, FIG. 14, and FIGS. 15A, 15B, 15C and 15D illustrate the change of the cell hierarchical structure in the third embodiment according to the flowchart of FIG. 12.

At step S205, if the child cell is in a single arrangement, it will be exploded. If it is in an array arrangement, the overlapping element not covered completely will be exploded. At this time, cell C is exploded into cell A. As a result of the explosion, the hierarchical structure of the cell is as shown in FIG. 13A. Specifically, shape Pc is registered as the shape Pa" of the cell and the array arrangement of cell D is allowed to be referred to in cell A. Control returns to step S202.

Because the judgment at step S202 has shown that shape Pa' overlaps with the array arrangement of cell D in FIG. 13A, control goes to step S203. For the 4×4 array arrangement of cell D, the rightmost column 1×4 portion not covered completely with shape Pa' is exploded into cell A. As a result of the explosion, the hierarchical structure is as shown in FIG. 13B. Control returns to step S202. At this time, because there is no unprocessed overlapping area, control goes to step S206.

Figure 14:
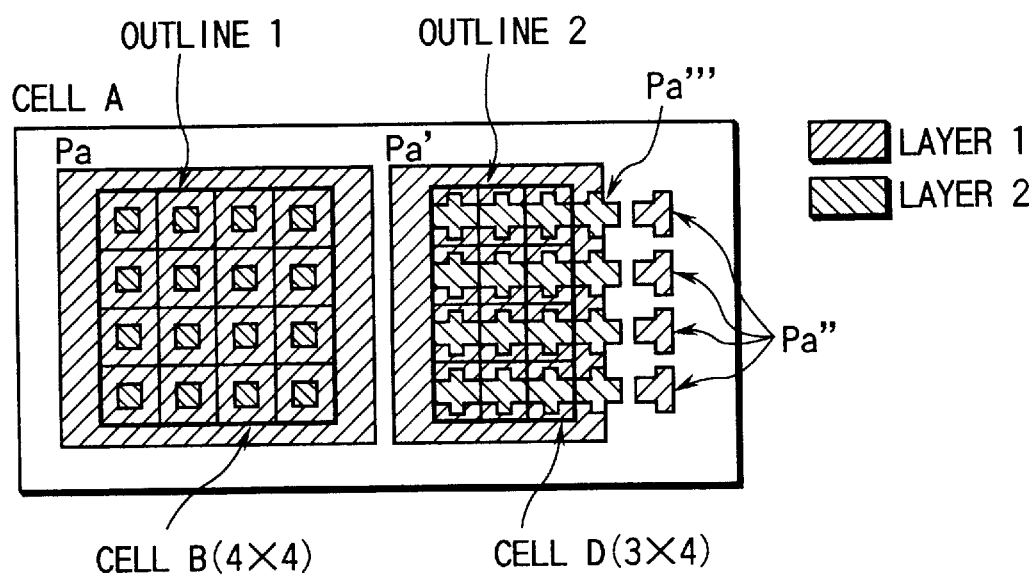

At step S206, it is determined whether or not there is any overlapping area in which no outline frame has been set. Because there is an area in which no outline frame has been set, an outline frame is set at step S207. Specifically, at step S207, an outline frame for setting pattern change is determined for the processed overlapping area of FIG. 13B. For the places for shape Pa and the 4×4 array arrangement of cell B, outline frame 1 in FIG. 14 is determined. For the places for shape Pa' and the 3×4 array arrangement of cell D, outline frame 2 is determined. Then, control proceeds to step S208.

Figure 15A:
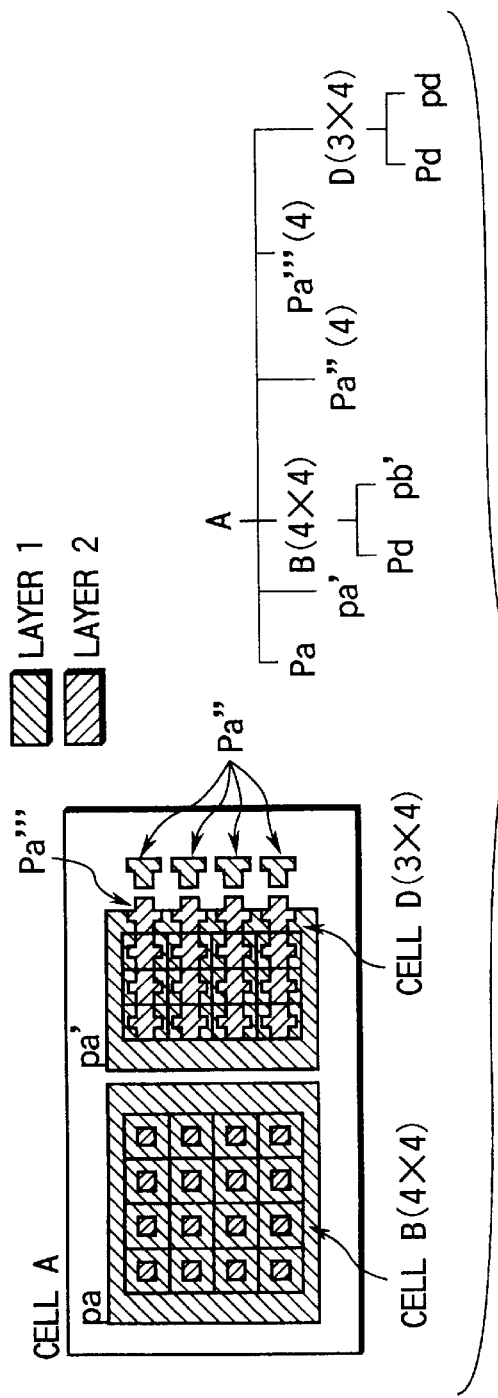
Figure 15B:
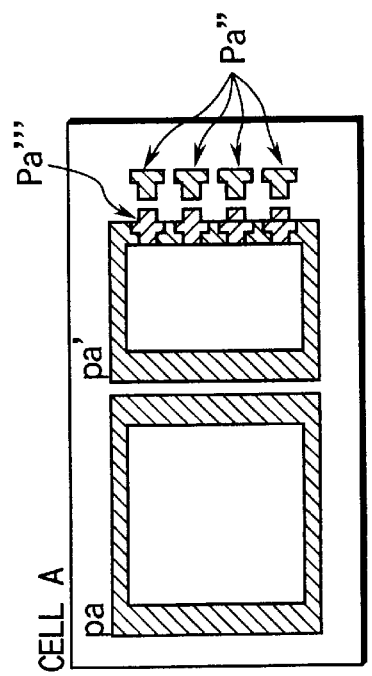
Figure 15C:
Figure 15D:

At step S208, it is determined whether or not there is any cell not subjected to a cell reconstruction process. If there is, the shape in the parent cell will be deleted and added into the shape of the child cell at step S209. Specifically, in the area specified by outline frame 1 of FIG. 14, the portion is deleted from shape Pa. In shape Pa enclosed by outline frame 1, a portion overlapping with one seed cell in cell B is added into cell B as the shape of cell B. A similar process is performed on outline frame 2, too. As a result, shapes Pa and Pa' belonging to cell A are changed to shapes pa and pa' in FIG. 15B, respectively. Furthermore, cell B and cell D are changed as shown in FIG. 15C and FIG. 15D, respectively. In FIG. 15A, the cells B and D differ from the original ones. Therefore, they should be referred as other names. However, for the sake of simplicity of explanation, the cells after being changed are referred as the same names in the present specification. The hierarchical structure from cell A downward is as shown in FIG. 15A. Thereafter, control goes to step S210.

At step S210, it is determined whether or not there is any cell in the one level below. If there is not, the process will be terminated. If there is, the target will be changed to the one level below and control will return to step S202.

By the above processes, the hierarchical structure of the design data is changed as shown in FIG. 15A. Because there is no cell below the layer of cell B and cell D, the process is terminated.

The above processes correspond to the overlapping area extraction process S021, the outline frame generation process S022, and the cell shape reconstruction process S023 in FIG. 10. Thereafter, control returns to the hierarchical optimization process S2 in FIG. 10.

Figure 16:
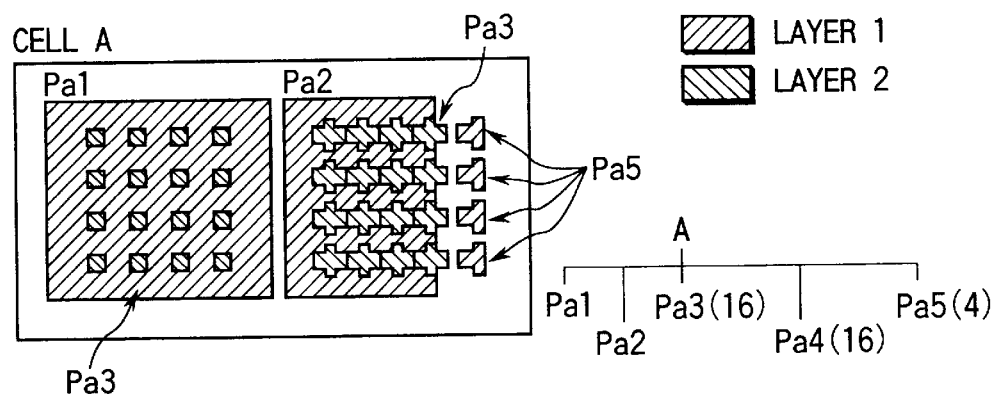
FIG. 16 is a diagram to explain the effect of shortening the shape data operation time in the third embodiment.
Figure 17:
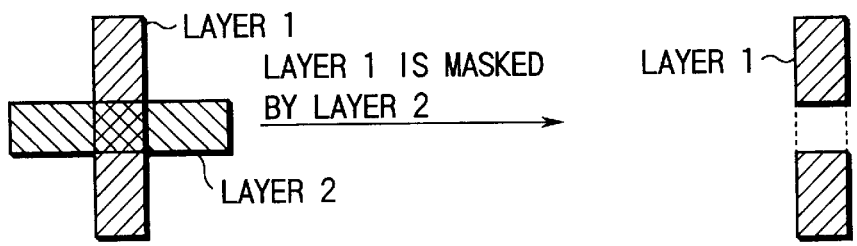
FIG. 17 shows mask operation to explain the effect of the third embodiment.

The preprocess in the third embodiment shortens the time required for the subsequent shape data operation process (step S3 in FIG. 5 and FIG. 10). The reason for this will be explained in detail. For the sake of comparison, consider an example of exploding the cells into a higher level in the hierarchical optimization process when they overlap. In this case, the hierarchical structure of the design data is changed as shown in FIG. 16. Consider a case where layer 1 is subjected to mask operation using layer 2 in the shape data operation process. Mask operation is one of Boolean geometric operation by which a shape area defined on a layer is deleted from a shape defined on another layer as shown in FIG. 17. In the case of an example shown in FIG. 16, the number of processes performed to subject a shape in layer 1 to mask operation using a shape in layer 2 is 32 (i.e., 16 processes for shape Pa1 and 16 processes for shape Pa2). With the third embodiment, because mask operation is performed on the seed patterns in the array portions of cell B and cell D, the number of processes needed for mask operation is six (i.e., one process for shape Pa, one process for shape Pa', and four processes for shape Pa" in FIG. 15B). Since the processing time required for mask operation is proportional to the number of processes, the processing time in the third embodiment is shortened to about ⅕ of that in the prior art.

Figure 18A:
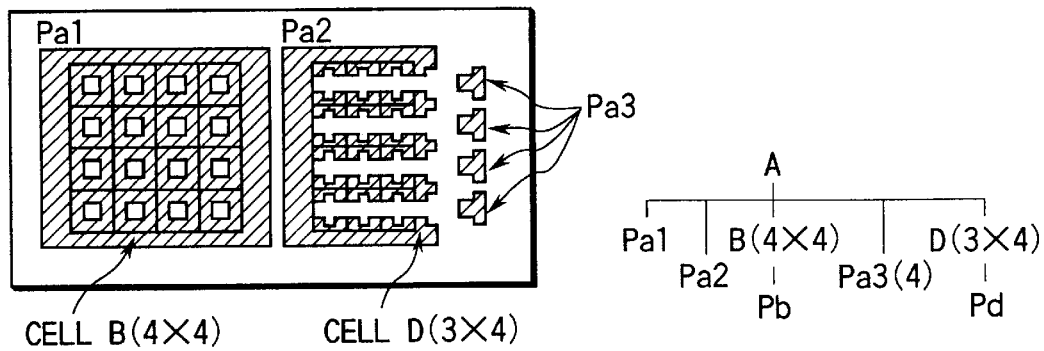
FIGS. 18A, 18B, 18C and 18D illustrate the cell hierarchical structure of the third embodiment to explain the shortening of the conversion time and the improvement of the compression efficiency in the third embodiment.
Figure 18B:
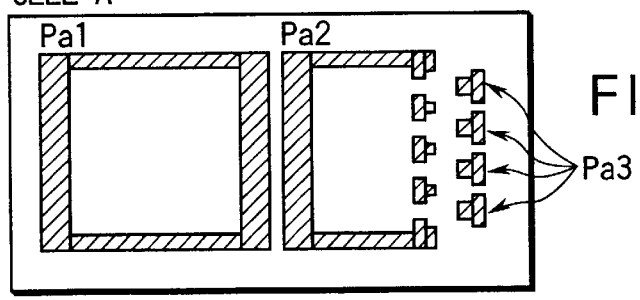
Figure 18C:
Figure 18D:

Furthermore, the preprocess of the third embodiment is effective in the improvement of the compression rate in the subsequent compression process (at step S4 in FIG. 5) and the shortening of the processing time. The reason for this will be explained in detail. The data structure of the exposure data obtained in the third embodiment is shown in FIG. 18A. The exposure device accepts only rectangular shapes and performs the process of dividing all the trapezoids in FIG. 15A into rectangles. In the third embodiment, because the portions of cell B and cell D are represented by a 4×4 array of the shape shown in FIG. 18C and a 3×4 array of the shape shown in FIG. 18D, only seed cells have to be defined. As a result, the number of rectangles is 35 (=4(Pa1)+13(Pa2)+8(Pa3)+4(B)+6(D)) in total.

Figure 19:
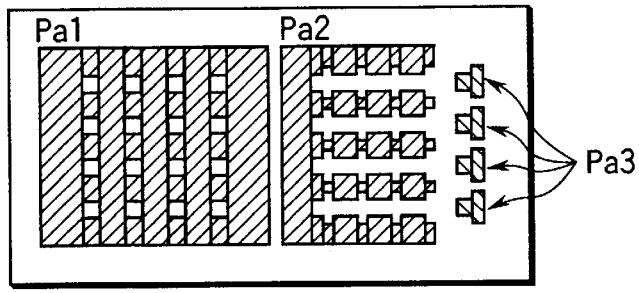
FIG. 19 shows a comparison to explain the shortening of the conversion time and the improvement of the compression efficiency in the third embodiment.

On the other hand, in the prior art, the number of rectangles is 74 in total as shown in FIG. 19. Since the amount of pattern data in the exposure data is proportional to the number of rectangles, it is found that the amount of pattern data in the third embodiment is reduced to about ½ of that in the prior art. When the number of repetitions of array defined on the design data is larger, the effect of shortening the conversion time and compressing the data expected in performing the data generation method of the third embodiment becomes much greater.

While in the third embodiment, the method of performing the preprocess before the hierarchical optimization process in a conventional hierarchical process has been explained, the preprocess may be incorporated in the conventional hierarchical optimization process.

With the third embodiment, the time required for the conversion processing is reduced remarkably by restructuring an array of overlapping cells into an array of unoverlapping cells. Because exposure data can be generated without exploding the arrays in the design data as much as possible, the amount of data can be compressed remarkably. As a result, the time needed to form a mask necessary for the manufacture of LSI is shortened and a data storage device for a manufacturing machine is made smaller in size, contributing to a decrease in manufacturing cost.

Furthermore, the rewriting of the design data is effected using the hierarchical information the design data has and no heavy overhead process, such as pattern matching generally performed to recognize the repetition of shapes in the design data, is not carried out. This makes the method very simple and effective in shortening the data conversion time.

Fourth Embodiment

A preprocess for the hierarchical optimization process according to a fourth embodiment of the present invention will be explained.

Figure 20:
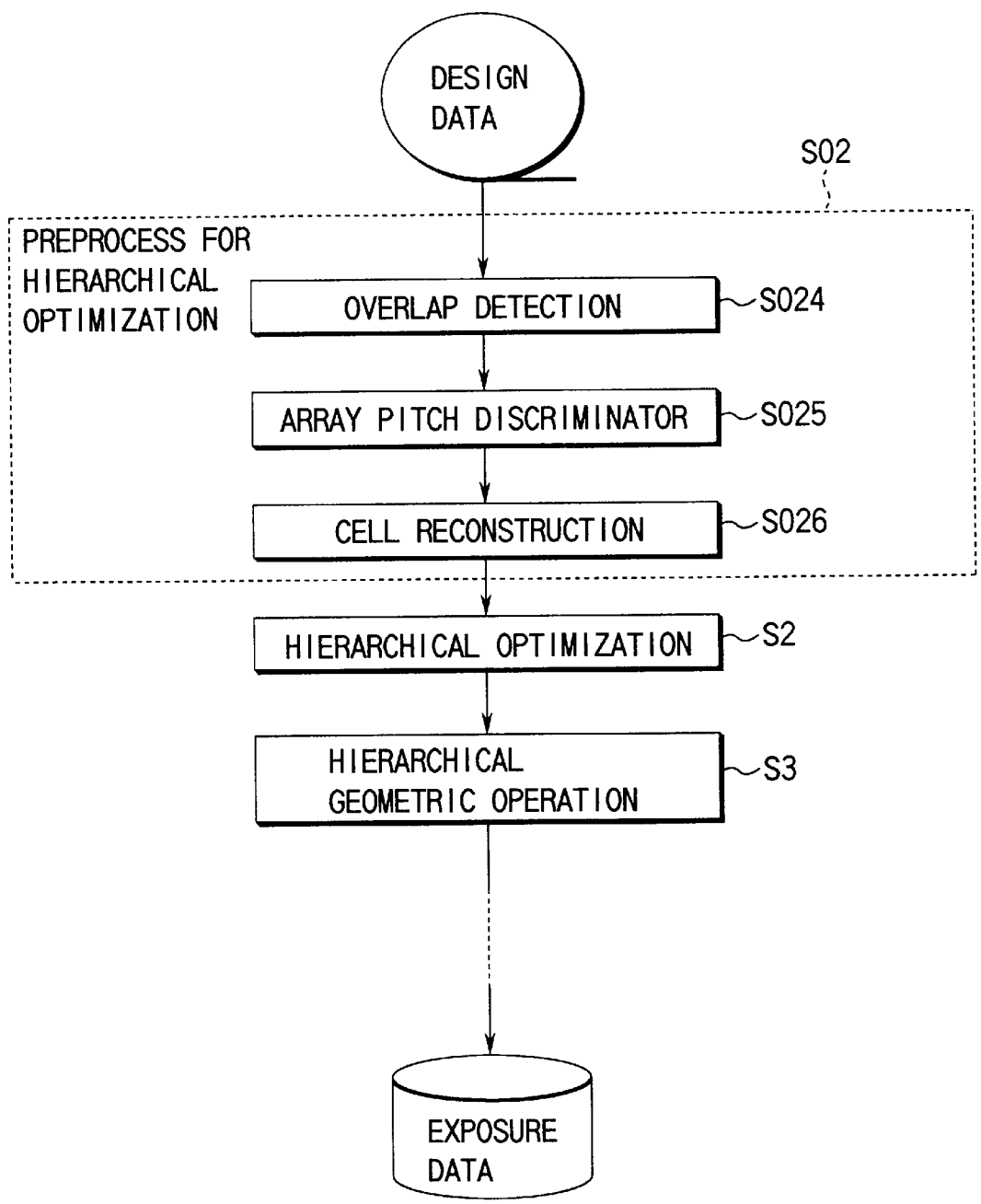
FIG. 20 is a flowchart for a preprocess for the hierarchical optimization process in a fourth embodiment of the present invention.

FIG. 20 is a detailed flowchart for the hierarchical optimization process of the fourth embodiment. The fourth embodiment is realized by the preprocess S02 for the ordinary hierarchical optimization process S2 (e.g., a doughnut process) shown in FIG. 5. The fourth embodiment is the same as the third embodiment except that an array pitch judgment process S025 is carried out instead of the outline frame generation process S022 of the third embodiment.

First, the root cell of the inputted design data is selected and determined to be a parent cell. The child cells defined for reference in the parent cell are subjected one by one to the preprocess shown in FIG. 20.

At a first step S024, overlapping arrays of child cells are found.

At a second step S025, based on the information in the design data, it is determined whether or not the array pitches of overlapping cells are the same.

At a third step S026, when the array pitches are the same, the shape of a child cell and the instance information referred to in the cell are added into another of the overlapping cells. The resulting cell is registered again and the hierarchical structure is changed.

After this process has been performed on all of the overlapping child cells in the root cell, the target level is shifted one level below and the above process is performed. The process is repeated until the lowest level has been processed.

After the hierarchical structure of the design data has been changed by the above process, the ordinary hierarchical optimization process (at step S2 in FIG. 5), such as a doughnut process, disclosed in reference 1 is performed. Then, shape data operation, such as resizing or tone reversal, is performed. Finally, a formatting process conforming to the format for the electron beam exposure device is carried out, which completes the data conversion process for the electron beam exposure device.

Figure 21C:
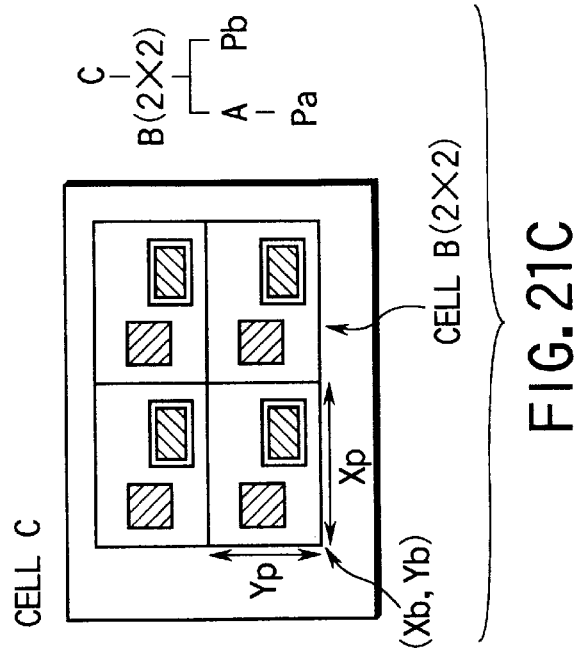
FIGS. 21A, 21B and 21C illustrate a cell hierarchical structure to help explain the fourth embodiment.
Figure 21A:
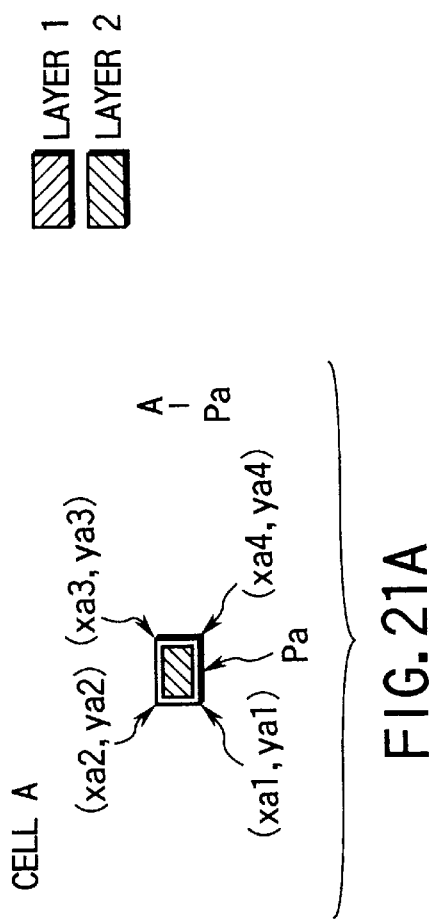
Figure 21B:
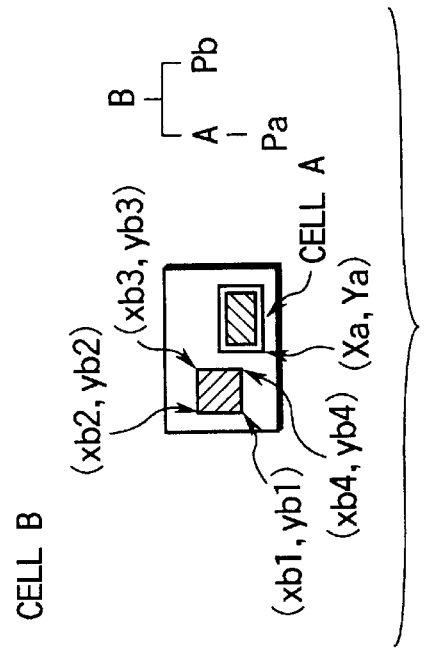

Before detailed explanation of the fourth embodiment, the format of the design data pattern will be described. The design data is assumed to have a hierarchical structure of cells shown in FIGS. 21A to 21C. Specifically, as shown in FIG. 21A, cell A has a single shape Pa. Cell B has a single shape Pb and cell A in a 1×1 array arrangement (a single arrangement) as an instance information as shown in FIG. 21B. Cell C has no shape belonging to itself but has cell B in a 2×2 array arrangement as an instance information.

When the design data is stored in a disk device in the computer, the format differs depending on the CAD system. For example, a typical format is shown in FIG. 22. Specifically, information on a cell is made up of shapes belonging to the cell itself and the instance information referred to in the cell. In the case of cell B, cell A is referred to as the instance information at the position (Xa, Ya) with respect to the origin of cell B. In addition, shape Pb cell B itself has is represented as a series of four vertexes in the section representing the shape with layer number 1 as shown in FIG. 22.

Figure 23A:
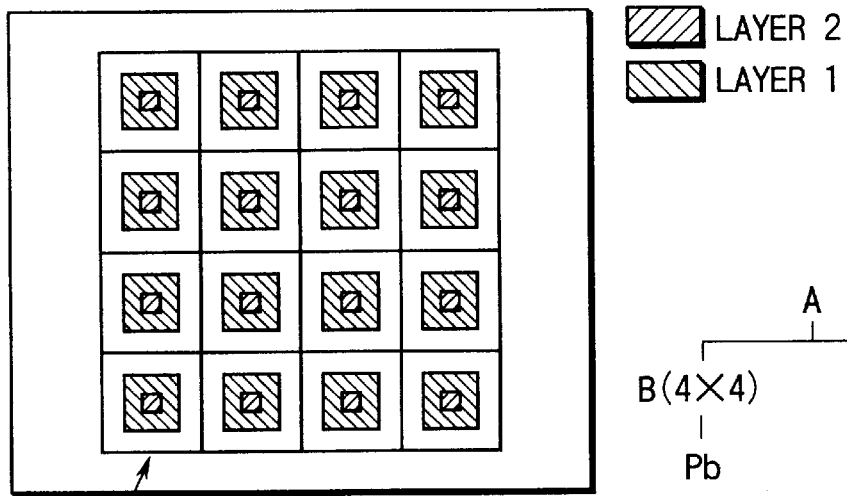
FIGS. 23A, 23B and 23C illustrate a cell hierarchical structure to help explain the fourth embodiment.
Figure 23B:
Figure 23C:
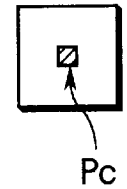
Figure 24:
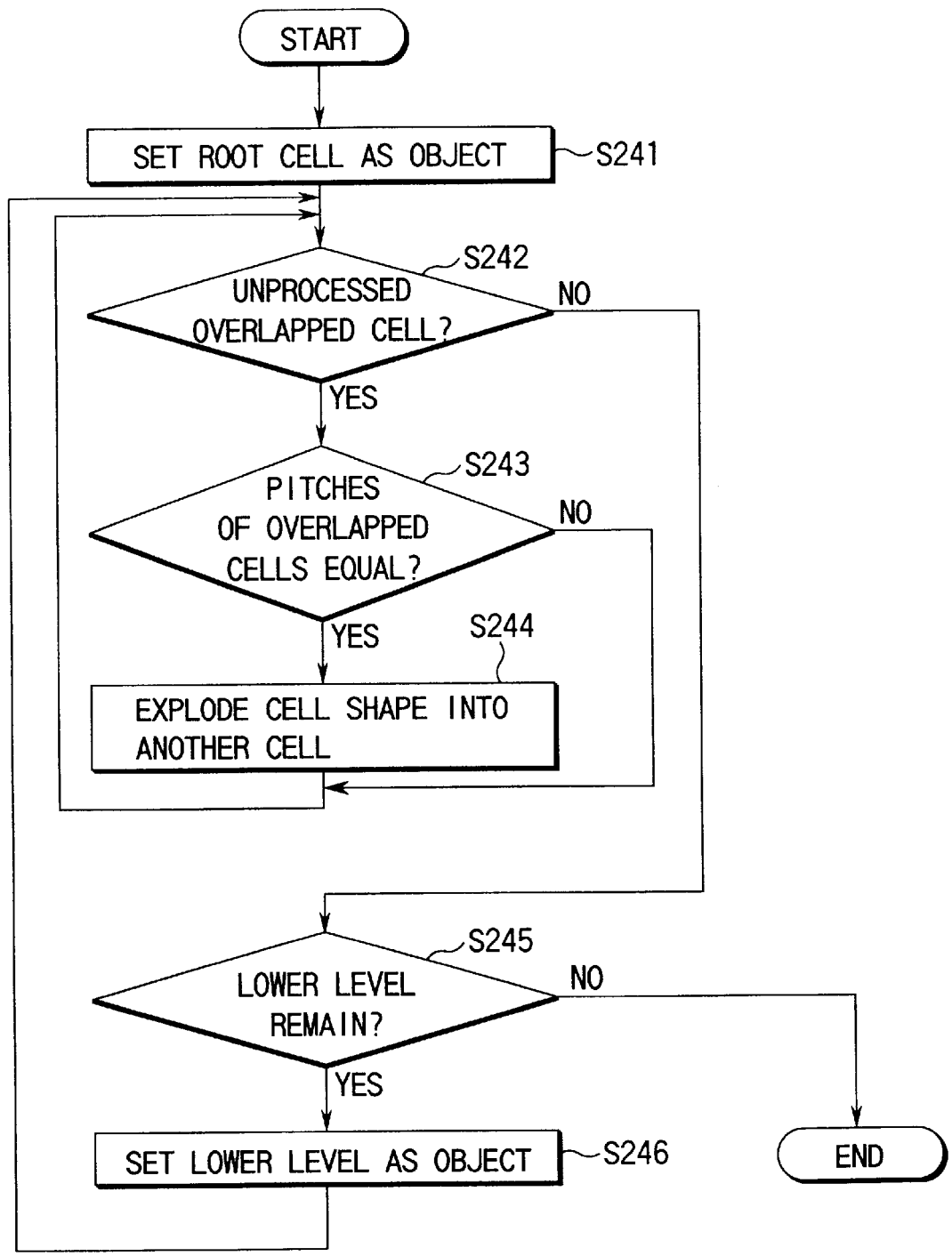
FIG. 24 is a detailed flowchart for the preprocess for the hierarchical optimization process in the fourth embodiment.

The fourth embodiment will be explained in detail in parallel with explanation of a case where the fourth embodiment has been applied to the design data shown in FIGS. 23A to 23C. As shown in FIG. 23A, cell A in the highest level (root) in the design data has cell B arranged in a 4×4 array and the instance information arranged so that cell C of the same size may overlap with cell B. According to a detailed flowchart for the fourth embodiment of FIG. 24, a case where the fourth embodiment is applied to the design data will be explained.

At step S241, the cells in the highest level (the root cell) are to be processed.

As step S242, it is determined whether or not there is any unprocessed overlapping area. If there is an overlapping area, control will proceed to step S243. Because the 4×4 array arrangement of cell B overlaps with the 4×4 array arrangement of cell C, it is selected as unprocessed overlapping cells.

At step S243, it is determined whether or not the array pitches of the overlapping cells are the same. Specifically, the pitches of the array of cell B and that of cell C are retrieved from the corresponding portions of the internal representation of the design data as shown in FIG. 22. Because the pitches of the array of cell B and that of cell C are the same, control goes to step S244.

Figure 25A:
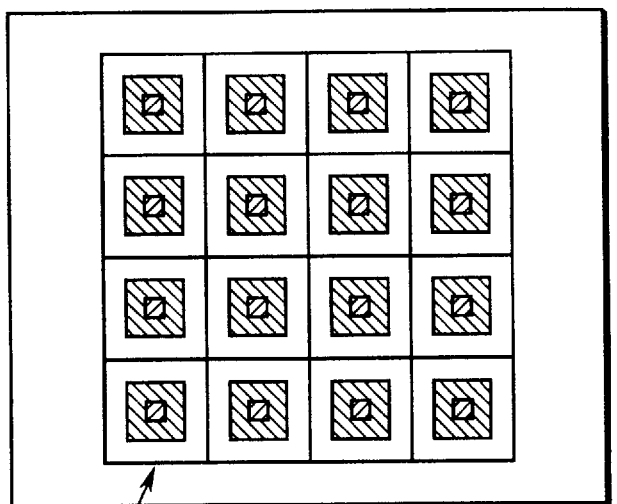
FIGS. 25A and 25B illustrate the change of the cell hierarchical structure in the fourth embodiment.
Figure 26:
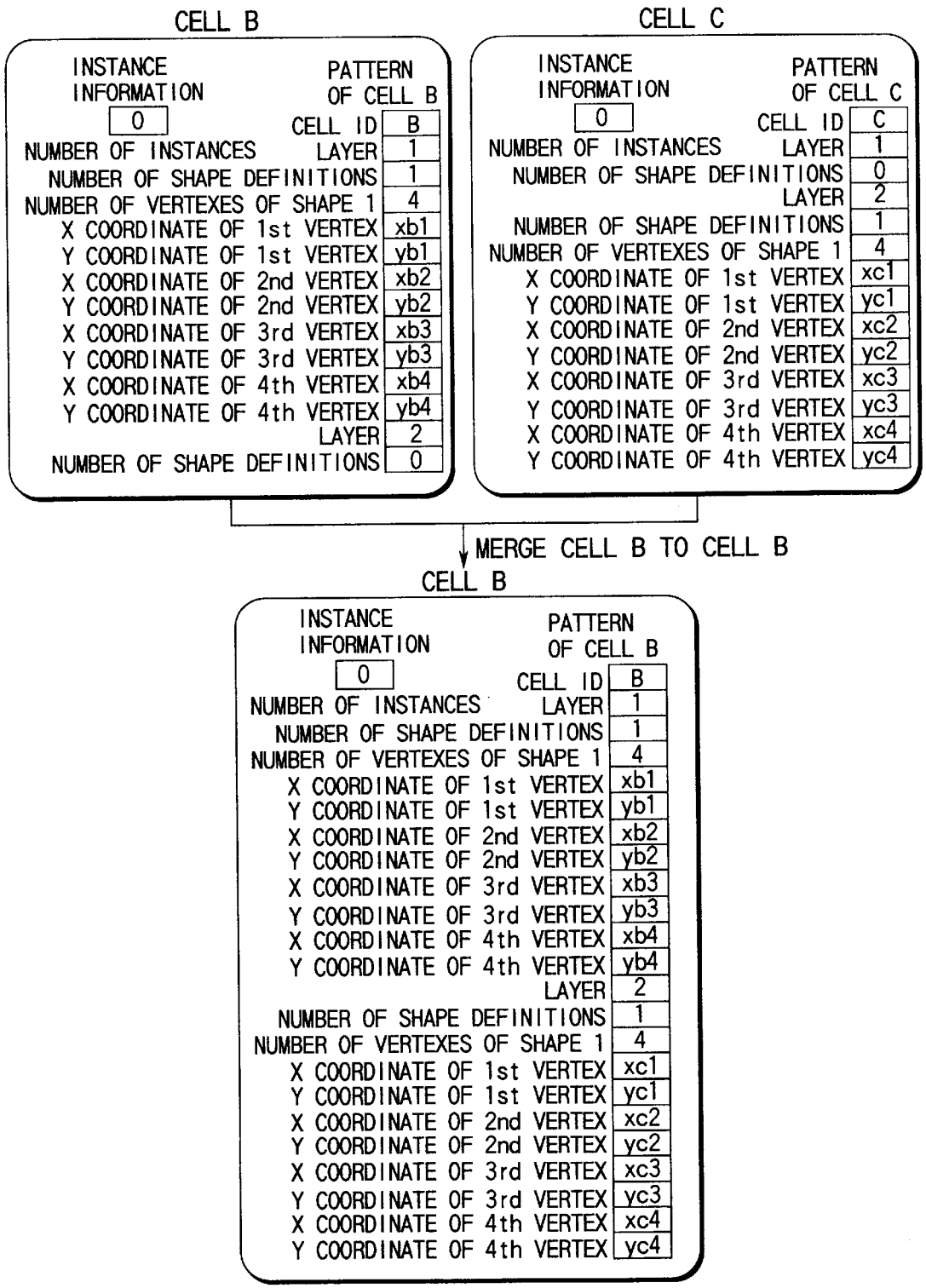
FIG. 26 shows the formats of the design data processed in the fourth embodiment.

At step S244, the shape of a cell is added into another cell. Here, the shape of cell C is added into cell B. At the same time, cell C is deleted from the hierarchical tree. As a result of this change, the hierarchical structure of the design data is as shown in FIG. 25A. FIG. 26 shows the change so that it may correspond to the format of the design data in the computer. Thereafter, control returns to step S242 and the sensing of unprocessed overlapping cells is continued. When the unprocessed overlapping cells have run out, it is determined at step S245 whether or not there is any lower level. If there is not, the process will be terminated. If there is, process will go to the lower level at step S246. In the present embodiment, because cell is the lowest level, the process is terminated, followed by the conventional hierarchical optimization process, the shape data operation process, and the format process for the exposure device.

In the present embodiment, because only pattern data exists in cell C and no instance information is arranged in cell C, only pattern data is added into cell B at step S244. When the instance information is referred to in cell C, however, the instance information arrangement is also added into cell B.

Figure 25B:
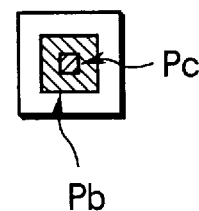
Figure 27A:
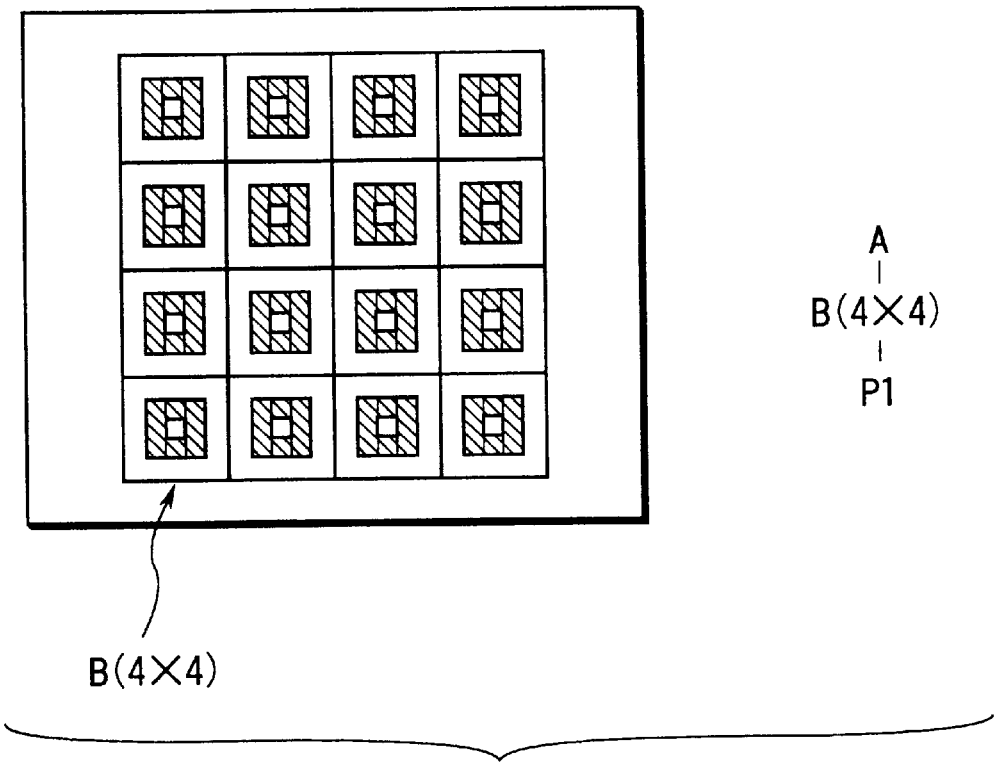
FIGS. 27A and 27B show a cell hierarchical structure to explain the effect of shortening the shape data operation time in the fourth embodiment.
Figure 27B:

Next, the effect that the preprocess in the fourth embodiment has on the shape data operation process and the formatting process will be explained. Consider an example of subjecting layer 1 of the design data in FIG. 23A to mask operation using layer 2. In the fourth embodiment, the hierarchical structure of the design data is changed as shown in FIG. 25A. The resulting data is subjected to the mask operation hierarchically. Specifically, the shape data operation to mask layer 1 with layer 2 includes only the process of subjecting shape Pb of cell B in FIG. 25B to a mask operation using shape Pc. In this case, the number of shape data operations is one. FIGS. 27A and 27B show the results of performing the mask operation and then the format process for the exposure device. In the exposure device, because shapes must be represented by rectangles or triangles, the shape of cell B is represented by four rectangles, not by a single doughnut-like polygon.

On the other hand, in the prior art, when overlapping cells are exploded into a higher level in hierarchical optimization, all of the shapes of cell B and cell C are exploded so that they may belong to cell A in the design data of FIG. 23A. In this case, the number of processes needed to subject layer 1 to a mask shape data operation using layer 2 is 16. As a result, in the fourth embodiment, the processing time required for mask geometric operation is 1/16 of that in the prior art.

Figure 28:
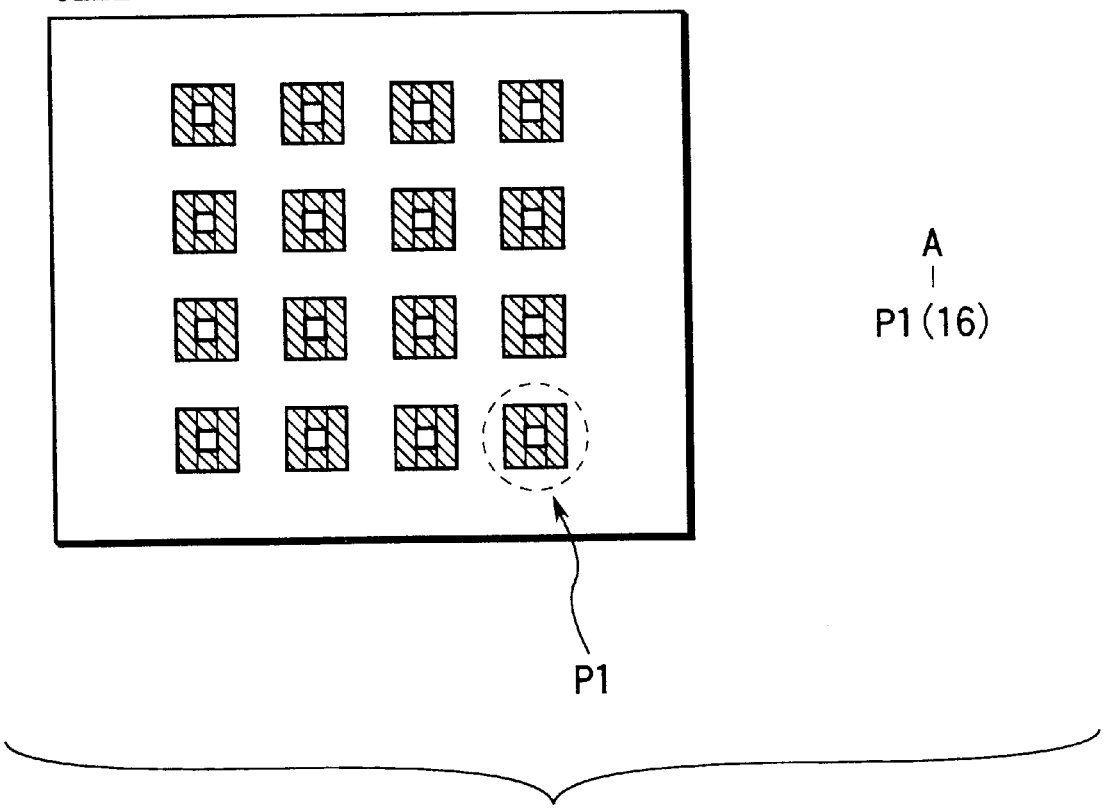
FIG. 28 shows a comparable cell hierarchical structure to explain the effect of shortening the shape data operation time in the fourth embodiment.

In the prior art shown in FIG. 28, the number of pattern data items is 64 (=4×16), whereas it is four in the fourth embodiment shown in FIG. 27A. Since the volume of the exposure data is proportional to the number of shapes, the amount of pattern data in the fourth embodiment decreases to 1/16 of that in the prior art.

In the comparison of the present embodiment with the prior art equivalent, the effect of shortening the shape data operation time and the effect of compressing the amount of pattern data in the exposure data are inversely proportional to the product of the number of repetitions of array. For example, when cell B and cell C are defined on a 10×10 array arrangement in FIG. 23A, both the shape data operation time and the amount of pattern data are 1/100 of those in the prior art.

As explained above, while in the fourth embodiment, the method of performing the preprocess before the hierarchical optimization process in the conventional hierarchical process has been explained, the preprocess may be incorporated in the conventional hierarchical optimization process.

Fifth Embodiment

A preprocess for the hierarchical optimization process according to a fifth embodiment of the present invention will be explained.

Figure 29:
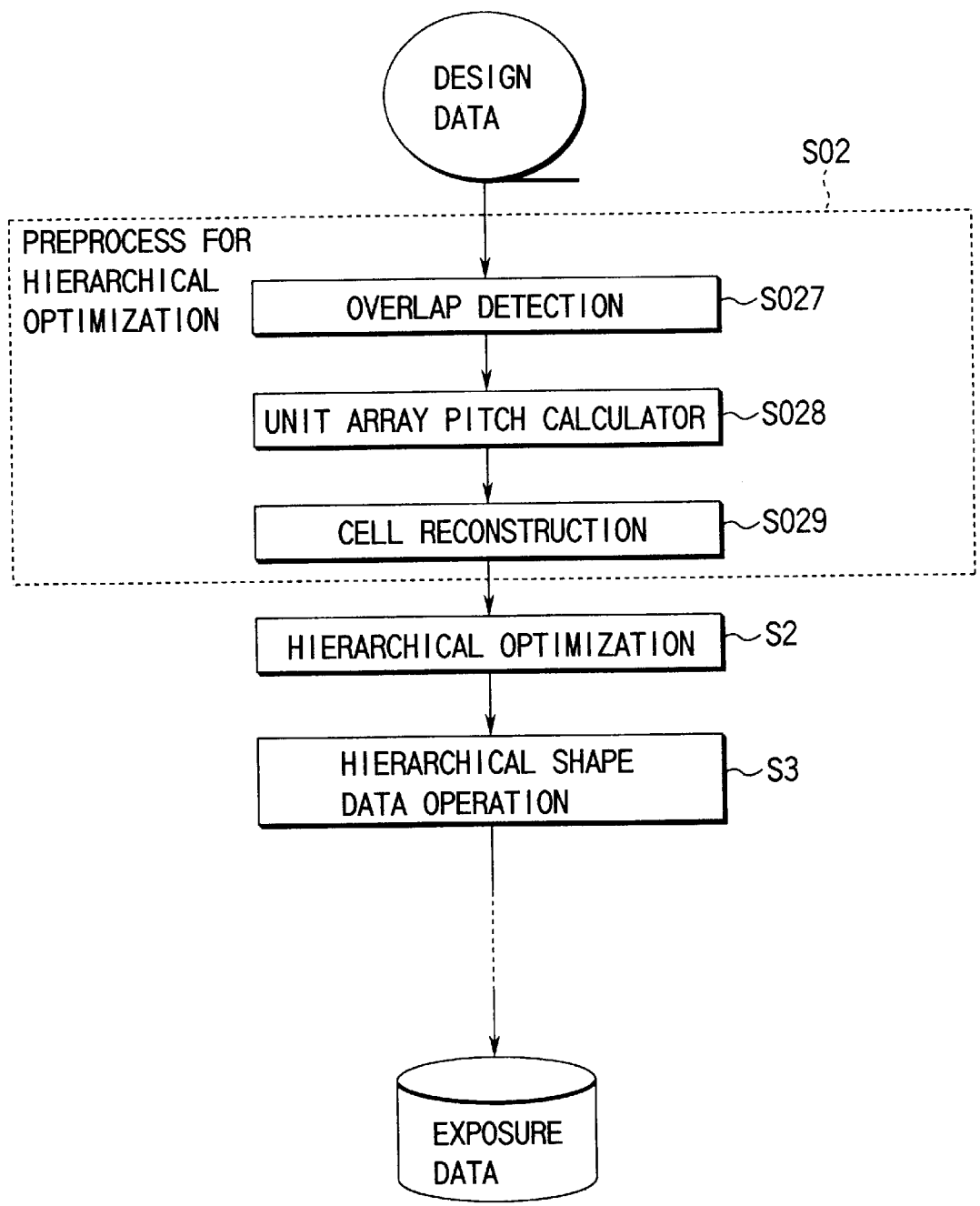
FIG. 29 is a flowchart for a preprocess for the hierarchical optimization process in a fifth embodiment of the present invention.

FIG. 29 is a detailed flowchart for the hierarchical optimization process of the fifth embodiment. The fifth embodiment is realized by the preprocess S02 for the ordinary hierarchical optimization process (e.g., a doughnut process) S2 shown in FIG. 5. The fifth embodiment is the same as the fourth embodiment except that a unit array pitch computing process S028 is performed instead of the array pitch judgment process S025 of the fourth embodiment.

First, the root cell of the inputted design data is selected and determined to be a parent cell. The child cells defined for reference in the parent cell are subjected one by one to the preprocess shown in FIG. 29.

At a first step S027, overlapping arrays of child cells are found.

At a second step S028, the least common multiple of the overlapping array pitches of child cells (hereinafter, referred to as the unit array pitch) is found. Specifically, based on information on the array pitch in the design data, the unit array pitch is determined.

At a third step S029, new cell data is generated from the shapes of the overlapping child cells. The new cell data uses the unit array pitch determined at step S028 as a unit of repetition. At the same time, information on the overlapping child cells is deleted from the hierarchical structure of the design data. Then, a new cell is added to the hierarchical structure for restructuring.

After this process has been performed on all of the overlapping child cells in the root cell, the target level is shifted one level below and the above process is performed. The process is repeated until the lowest level has been processed.

After the hierarchical structure of the design data has been changed by the above process, the ordinary hierarchical optimization process (at step S2 in FIG. 5), such as a doughnut process, disclosed in reference 1 is performed. Then, a shape data operation process, such as resizing or tone reversal, is performed. Finally, a formatting process conforming to the format for the electron beam exposure device is carried out, which completes the data conversion process for the electron beam exposure device.

Figure 31:
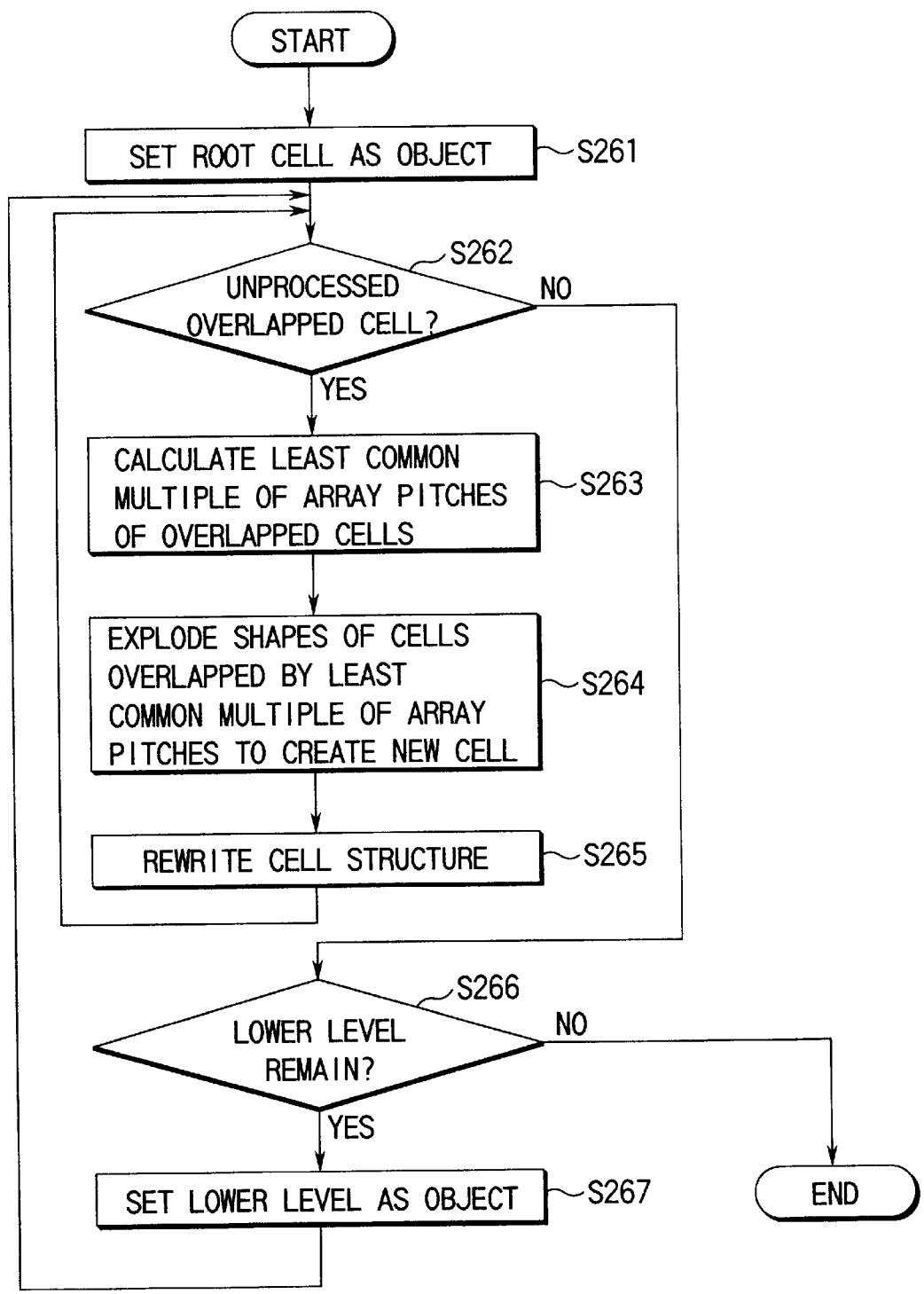
FIG. 31 is a detailed flowchart for the preprocess for the hierarchical optimization process in the fifth embodiment.

The fifth embodiment will be explained in detail in parallel with explanation of a case where the fifth embodiment has been applied to the design data shown in FIGS. 30A to 30C. In cell A in the highest level (root) in the hierarchy of the design data, the instance information is arranged so that the 4×4 array of cell B and the 4×2 array of cell C may overlap, with their origins of arrangement aligning with each other. It is to be noted that the pitches of the respective array equal to the cell size shown in FIG. 30B and FIG. 30C. The data is actually represented in the format explained in FIG. 22. According to a detailed flowchart in FIG. 31, a case where the fifth embodiment has been applied to the design data will be explained.

At step S261, cells in the highest level (the root cell) are to be processed.

As step S262, it is determined whether or not there is any unprocessed overlapping area. If there is an overlapping area, control will proceed to step S263. Here, because the 4×4 array arrangement of cell B overlaps with the 4×2 array arrangement of cell C, it is selected as unprocessed overlapping cells.

At step S263, the least common multiple of the array pitches of the overlapping cells is determined. Specifically, the pitches of the array of cell B and that of cell C are retrieved from the corresponding portions of the internal representation of the design data as shown in FIG. 22. As a result, the pitch of cell B is: Xpb=5 $\mu$m, Ypb=5 $\mu$m. The pitch of cell C is: Xpc=5 $\mu$m, Ypc=10 $\mu$m. From these values, the least common multiple of the array pitch of cell B and that of cell C is determined as follows: Xp=5 $\mu$m, Yp=10 $\mu$m.

At step S264, the overlapping cells are exploded with the least common multiple to create new cell data. Specifically, a new cell D is generated from two shapes of cell C and one shape of cell B so that Xp=5 $\mu$m Yp=10 $\mu$m may be an array pitch.

Figure 32A:
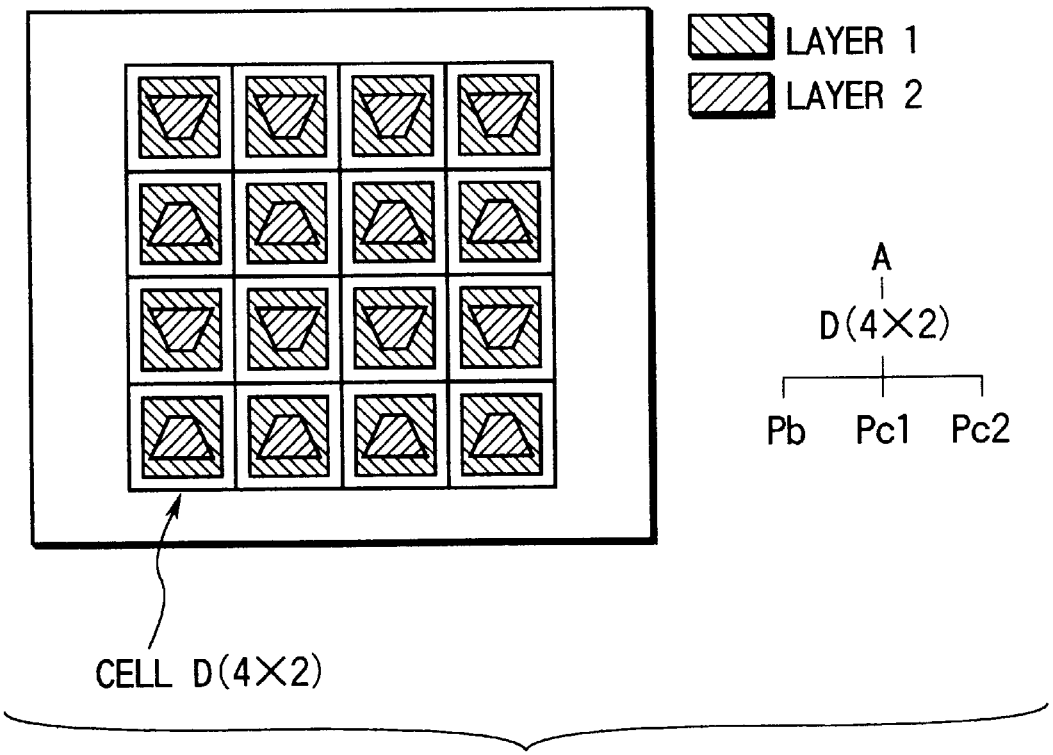
FIGS. 32A and 32B illustrate the change of the cell hierarchical structure in the fifth embodiment.
Figure 32B:
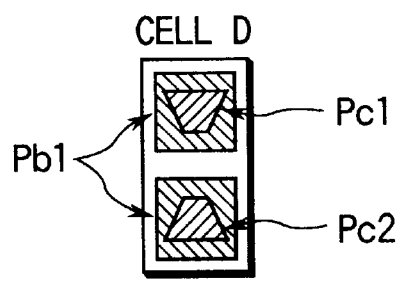

At step S265, information on overlapping cell B and cell C is deleted from the hierarchical tree. Information on cell D is introduced to change the hierarchical structure. As a result of this change, the hierarchical structure of the design data is as shown in FIGS. 32A and 32B.

Thereafter, control returns to step S262 and the sensing of unprocessed overlapping cells is continued. When the unprocessed overlapping cells have run out, it is determined at step S266 whether or not there is any lower level. If there is not, the process will be terminated. If there is, process will go to the lower level at step S267. In the fifth embodiment, because cell B is the lowest level, the process is terminated, followed by the conventional hierarchical optimization process, the shape data operation process, and the formatting process for the exposure device.

In the fifth embodiment, because only pattern data exists and no instance information is arranged in cell B and cell C, only pattern data is combined to create a new cell D at step S264. When the instance information has been referred to in cell B and cell C, the instance information arrangement is also combined to create cell D.

Figure 33A:
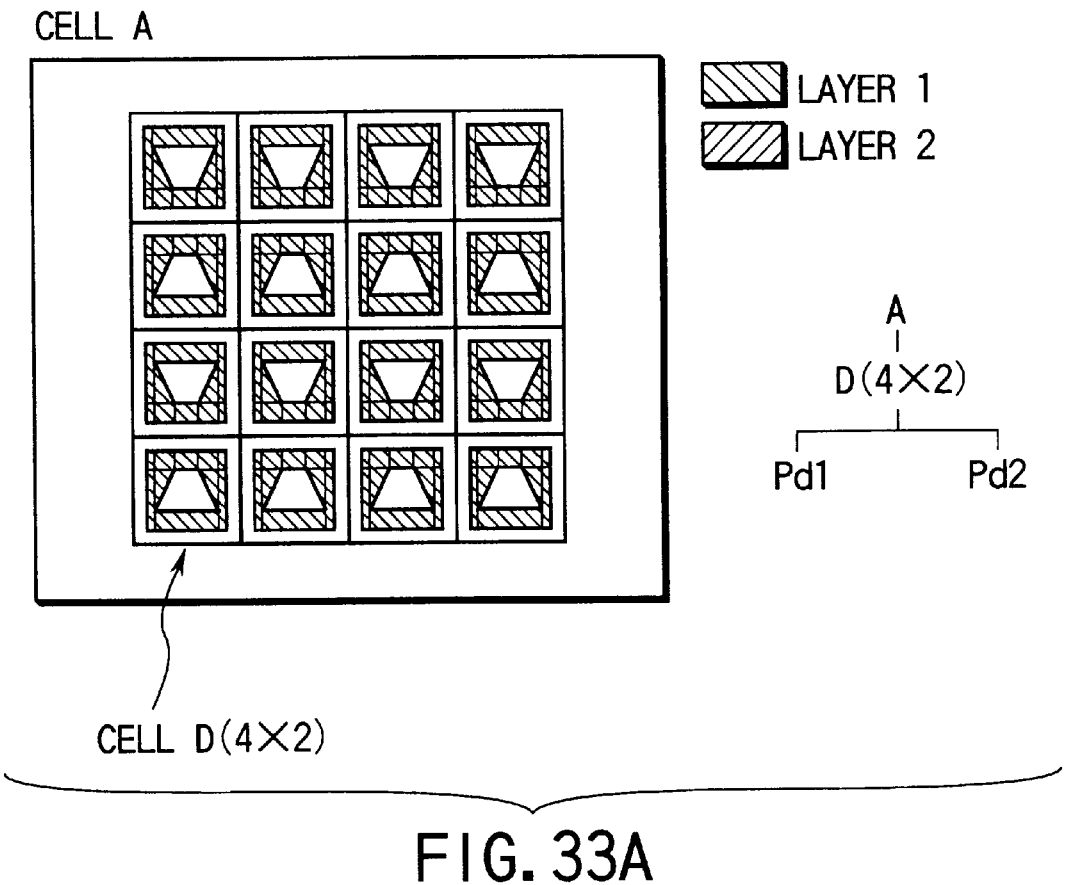
FIGS. 33A and 33B show a cell hierarchical structure to explain the effect of shortening the shape data operation time in the fifth embodiment.
Figure 33B:
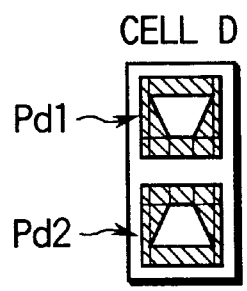

Next, the effect that the preprocess in the fifth embodiment has on the shape data operation process and the data formatting process will be explained. Consider an example of subjecting layer 1 of the design data in FIG. 30A to a mask operation using layer 2. In the fifth embodiment, the hierarchical structure of the design data is changed as shown in FIG. 32A. The resulting data is subjected to the mask operation hierarchically. Specifically, the shape data operation to mask layer 1 with layer 2 includes only the process of subjecting shape Pb of cell D in FIG. 32B to a mask operation using shape Pc1 and shape Pc2. In this case, the number of shape data operations is two. FIG. 33A shows the result of performing the formatting process for the exposure device. In the exposure device, because shapes must be represented in rectangles or triangles, shape Pd1 and shape Pd2 of cell D are each represented by eight shapes. Consequently, the number of shapes in cell D is 16.

Figure 34:
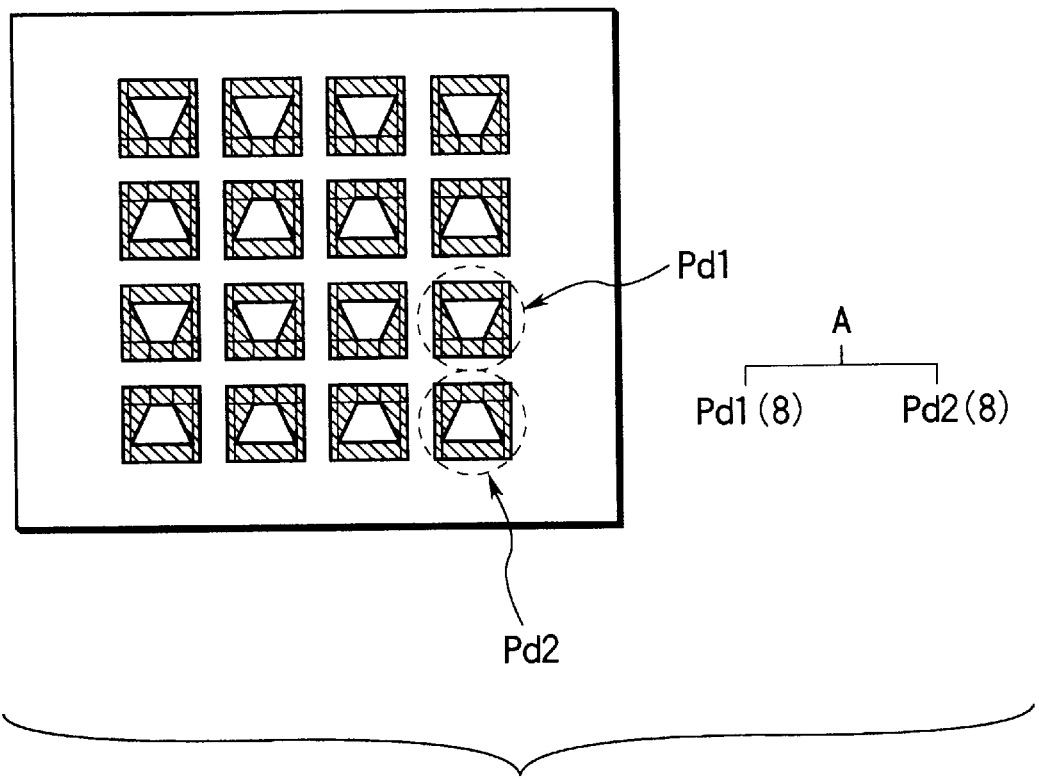
FIG. 34 shows a comparable cell hierarchical structure to explain the effect of shortening the shape data operation time in the fifth embodiment.

On the other hand, in the prior art, when overlapping cells are exploded into a higher level in hierarchical optimization, all of the shapes of cell B and cell C are exploded so that they may belong to cell A in the design data of FIG. 30A. In this case, the number of processes needed to subject layer 1 to a mask shape data operation using layer 2 is 16. As a result, in the fifth embodiment, the processing time required for shape data operation is ⅛ of that in the prior art. In the prior art shown in FIG. 34, the number of pattern data items is 128, whereas it is 16 in the fifth embodiment shown in FIG. 33A. Since the data volume of the exposure data is proportional to the number of shapes, the amount of pattern data in the fifth embodiment decreases to ⅛ of that in the prior art.

In the comparison of the present embodiment with the prior art equivalent, the effect of shortening the shape data operation time and the effect of compressing the amount of pattern data in the exposure data are inversely proportional to the product of the number of repetitions of array. For example, when cell B is defined on a 10×10 array arrangement and cell C is defined on a 10×5 array arrangement in FIG. 30A, both the shape data operation time and the amount of pattern data are ¹⁄₅₀ of those in the prior art.

As explained above, while in the fifth embodiment, the method of performing the preprocess before the hierarchical optimization process in the conventional hierarchical process has been explained, the preprocess may be incorporated in the conventional hierarchical optimization process.

Sixth Embodiment

A preprocess for the hierarchical optimization process according to a sixth embodiment of the present invention will be explained.

Figure 35:
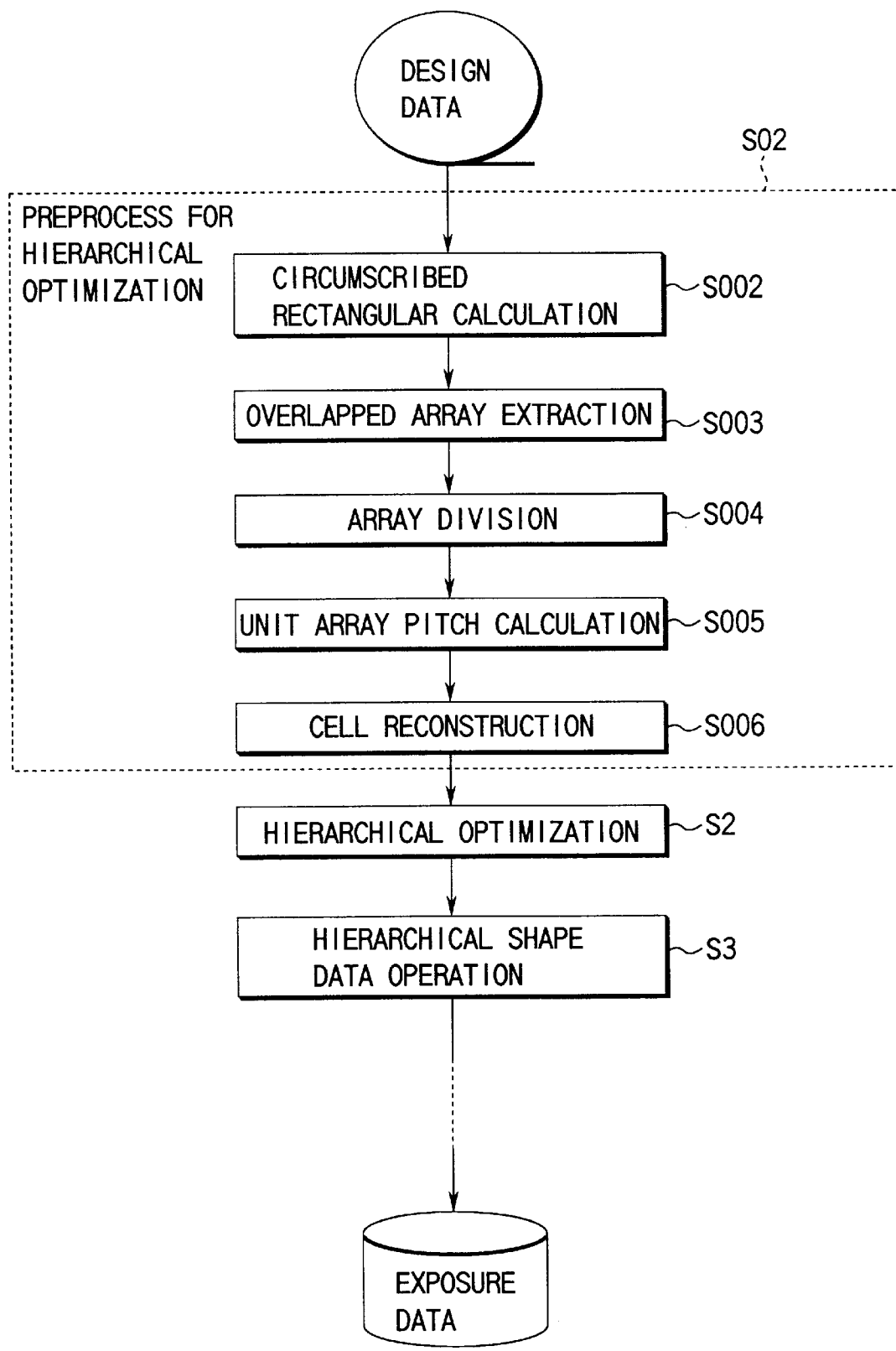
FIG. 35 is a flowchart for a preprocess for the hierarchical optimization process in a sixth embodiment of the present invention.

FIG. 35 is a detailed flowchart for the hierarchical optimization process of the sixth embodiment. The sixth embodiment is realized by the preprocess S02 for the ordinary hierarchical optimization process (e.g., a doughnut process) S2 shown in FIG. 5.

Figure 36A:
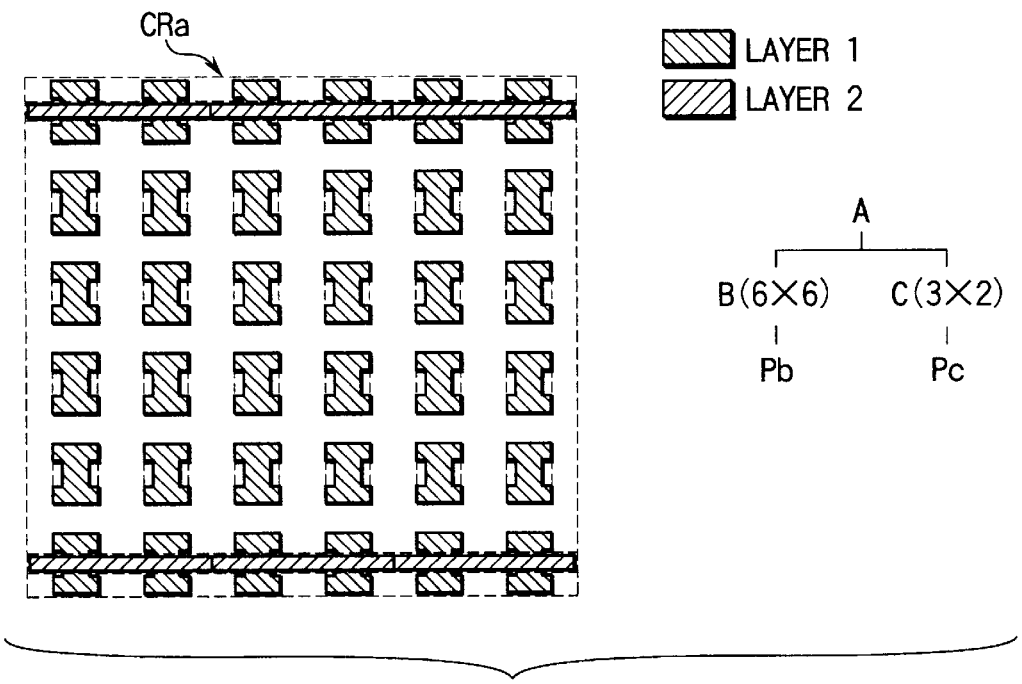
FIGS. 36A, 36B and 36C show the circumscribed rectangles of cells.
Figure 36B:
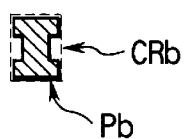
Figure 36C:
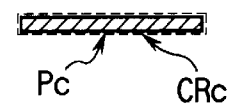

At a first step S002, a circumscribed rectangle is found for each cell in the design data. Of the vertexes of all shapes including the shapes in the instance information defined on a cell, the coordinates of the leftmost vertex at the bottom are determined to be (xll, yll) and the coordinates of the rightmost vertex at the top are determined to be (xru, yru). In this case, the circumscribed rectangle of a cell is a rectangle specified by the two vertexes. FIGS. 36A to 36C show circumscribed rectangles CRa, CRb, and CRc for cells A, B, and C, respectively. For some data format of CAD data, the coordinates of the circumscribed coordinates are registered as the size of the cell. In that case, the first step S002 may be omitted.

At a second step S003, a cell in the highest level (root) of the inputted design data is determined to be a parent cell. The child cells defined for instance information in the parent cell are subjected one by one to the process shown in FIG. 35. First, the arrays of child cells whose circumscribed rectangles of the arrays (hereinafter, referred to as array areas) overlap are extracted. For the arrays whose array areas overlap, the area in which the circumscribed rectangles of cells overlap is calculated.

At a third step S004, each array is divided into an area where the circumscribed rectangles of cells overlap and an area where the circumscribed rectangles of cells do not overlap.

At a fourth step S005, for the divided array structure, the least common multiple of the array pitches of overlapping cells is determined in the portions where the cell circumscribed rectangles overlap.

At a fifth step S006, a new cell with the pitch equal to the least common multiple of the array pitches determined as described above is generated by combining the shapes of overlapping cells and the instance information referred to in the cells (a cell shape reconstruction process). At the same time, the new cell is registered in the hierarchical tree and information on the overlapping cells from which the new cell was generated is deleted.

After the above process has been performed on all of the overlapping cells in the root cell, the target level is shifted one level below. Then, the above process is performed. The process is repeated until the lowest level has been processed.

After the hierarchical structure of the design data has been changed by the above process, the ordinary hierarchical optimization process (at step S2 in FIG. 5), such as a doughnut process, disclosed in reference 1 is performed. Then, a shape data operation process, such as resizing or tone reversal, is performed. Finally, a formatting process conforming to the format for the electron beam exposure device is carried out, which completes the data conversion process for the electron beam exposure device.

Figure 37A:
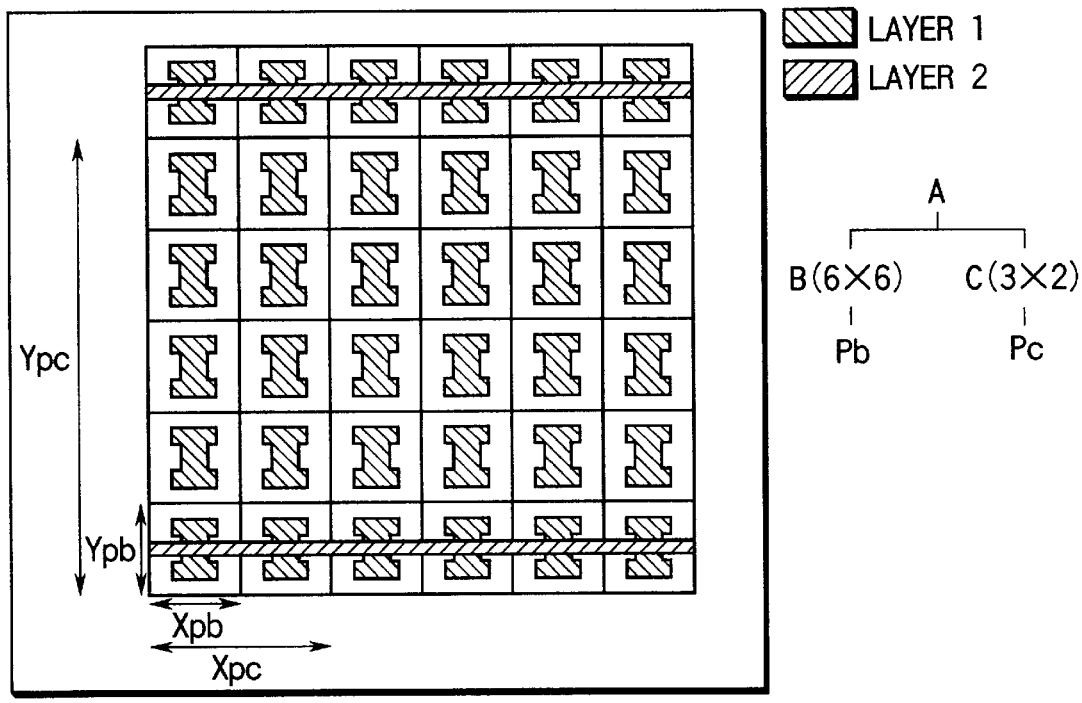
FIGS. 37A, 37B and 37C illustrate a cell hierarchical structure to help explain the sixth embodiment.
Figure 37B:
Figure 37C:
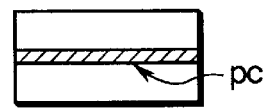

The sixth embodiment will be explained in detail in parallel with explanation of a case where the sixth embodiment has been applied to the design data shown in FIG. 37A. In cell A in the highest level (root) of the design data, the instance information is arranged so that the 6×6 array of cell B and the 3×2 array of cell C may overlap, with their origins of arrangement aligning with each other. The pitch of each array is as shown in FIG. 37A. The data is actually represented in the format explained in FIG. 22.

Figure 38:
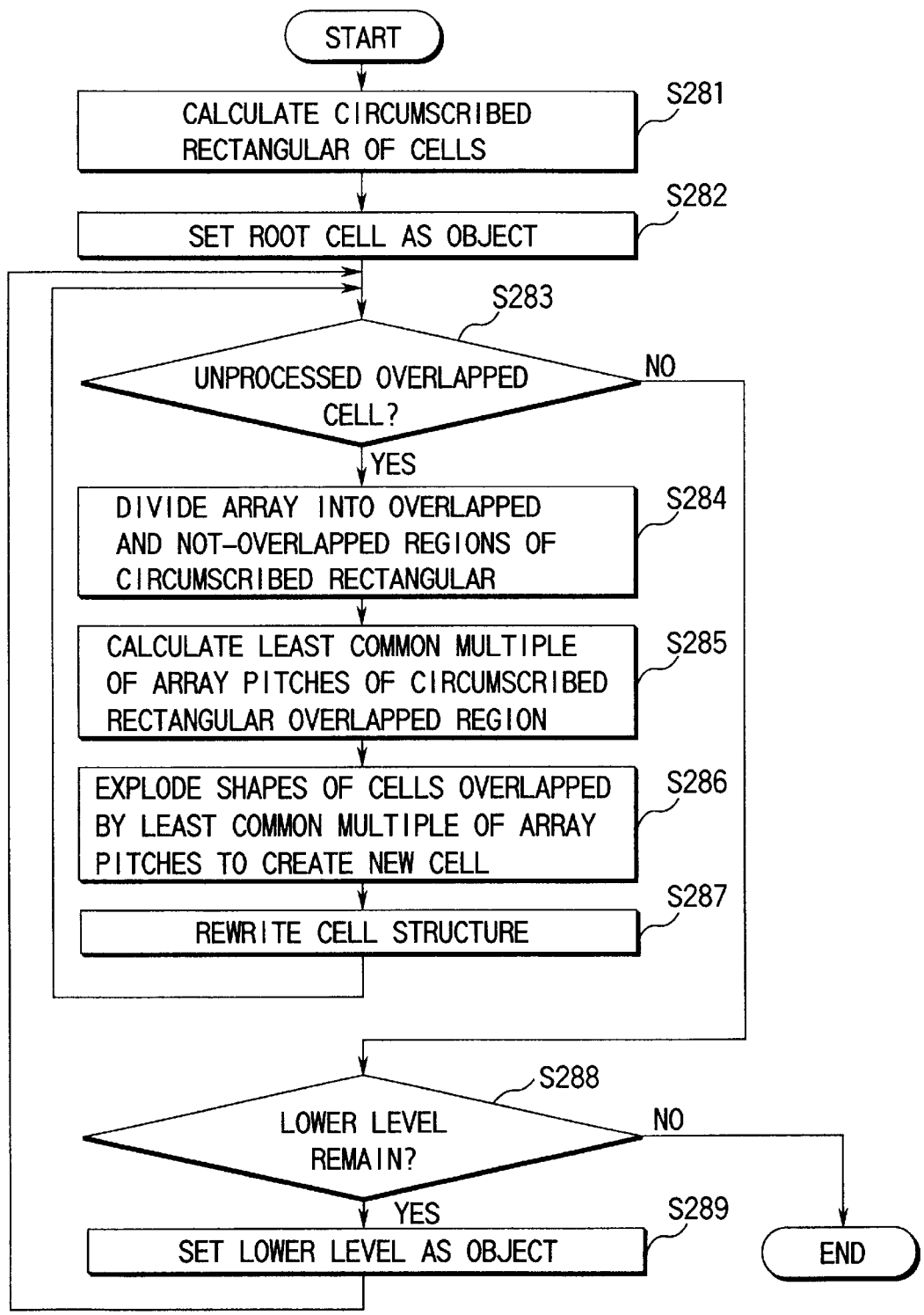
FIG. 38 is a detailed flowchart for the preprocess for the hierarchical optimization process in the sixth embodiment.

According to a detailed flowchart in FIG. 38, a case where the sixth embodiment has been applied to the design data will be explained.

At step S281, a circumscribed rectangle is found for each of all the cells. The results are shown in FIGS. 36A to 36C. The rectangles shown by broken lines in the figures are the circumscribed rectangles for the individual cells.

At step S282, the cell in the highest level (the root cell) are to be processed.

As step S283, it is determined whether or not there is any unprocessed overlapping area. If there is an overlapping area, control will proceed to step S284. Here, because the 6×6 array arrangement of cell B overlaps with the 3×2 array arrangement of cell C, it is selected as unprocessed overlapping cells.

Figure 39:
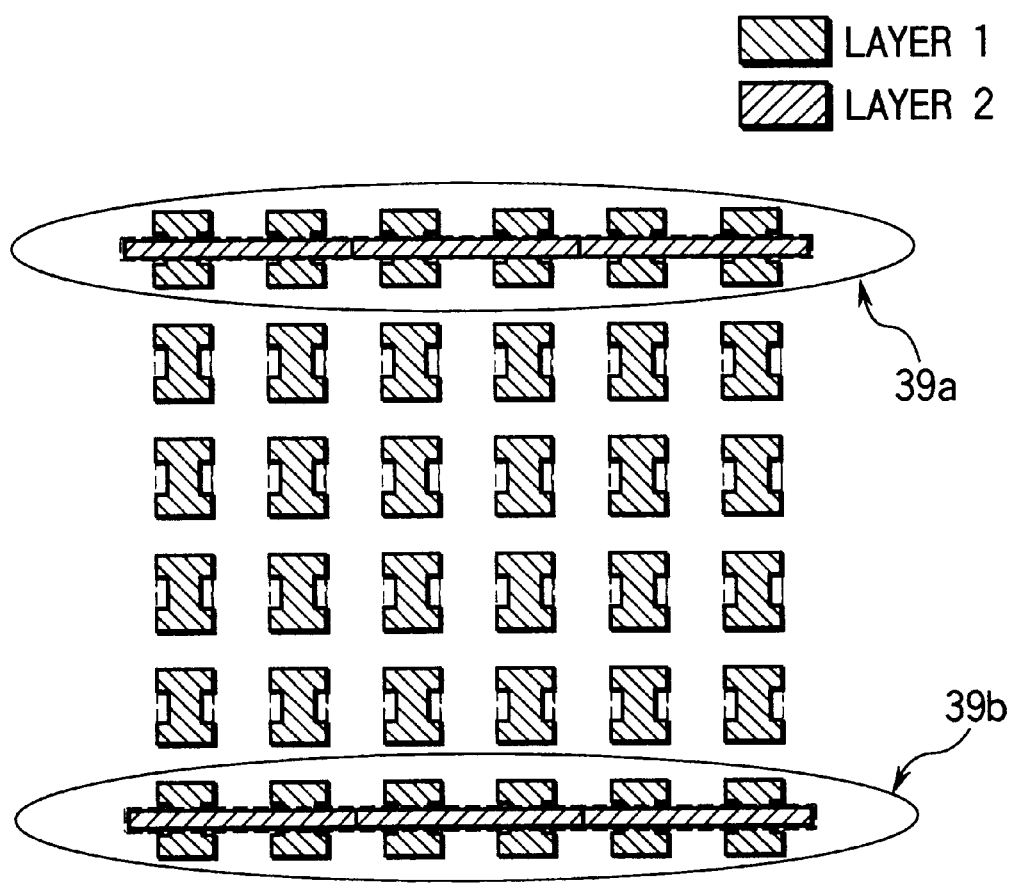
FIG. 39 shows the circumscribed rectangle overlapping area of cells in the sixth embodiment.
Figure 40:
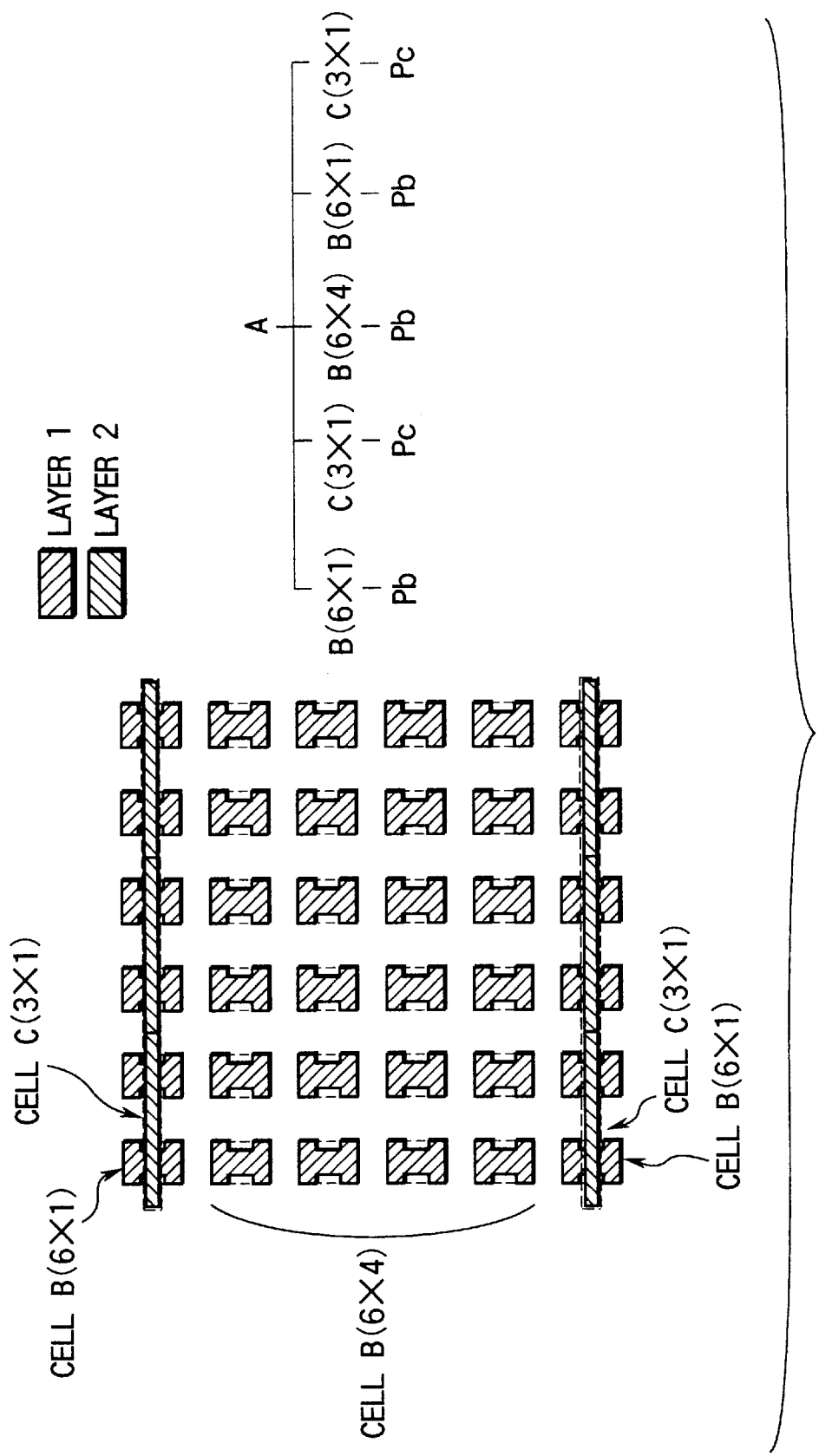
FIG. 40 is a diagram to help explain the array division process in the sixth embodiment.

At step S284, the area in which the circumscribed rectangles of cells overlap with the extracted array area is extracted. In FIG. 39, it is found in the cell circumscribed rectangle overlapping areas 39a and 39b that the circumscribed rectangle of cell B overlaps with the circumscribed rectangle of cell C. Array information on each cell is divided into an area where the cell circumscribed rectangles overlap and an area where the cell circumscribed rectangles do not overlap. The result is shown in FIG. 40.

At step S285, the pitches of the array of cell B and that of cell C are retrieved from the corresponding portions of the internal representation of the design data as shown in FIG. 22. As a result, the pitch of cell B is: Xpb=5 $\mu$m, Ypb=0 $\mu$m. The pitch of cell C is: Xpc=10 $\mu$m, Ypc=0 $\mu$m. From these values, the least common multiple of the array of cell B and that of cell C is determined as follows: Xp=10 $\mu$m, Yp=0 $\mu$m.

At step S286, the shape of cell B and that of cell C in the frame specified by the least common multiple of the array pitch are read from the internal information to create a new cell D.

At step S287, in the hierarchical tree, information on cell B and cell C corresponding to the area in which the new cell is to be placed is replaced with information on cell D to change the hierarchical structure. As a result of this change, the hierarchical structure of the design data is as shown in FIGS. 41A and 41C.

Thereafter, control returns to step S283 and the sensing of unprocessed overlapping cells is continued. When the unprocessed overlapping cells have run out, it is determined at step S288 whether or not there is any lower level. If there is not, the process will be terminated. If there is, process will go to the lower level at step S289. In this example, because cell B is the lowest level, the process is terminated, followed by the conventional hierarchical optimization process, the shape data operation process, and the formatting process for the exposure device.

In this example, because only pattern data exists and no instance information is arranged in cell B and cell C, only pattern data is combined to create a new cell D at step S286. When the instance information has been referred to in cell B and cell C, the instance information arrangement is also combined to create cell D.

Next, the effect that the preprocess in the sixth embodiment has on the shape data operation process and the data formatting process will be explained. Consider an example of subjecting layer 1 of the design data in FIG. 37A to geometric sum (perform OR process) using layer 2. In the sixth embodiment, the hierarchical structure of the design data is changed as shown in FIGS. 41A to 41C. The resulting data is subjected to the mask operation hierarchically.

Figure 42A:
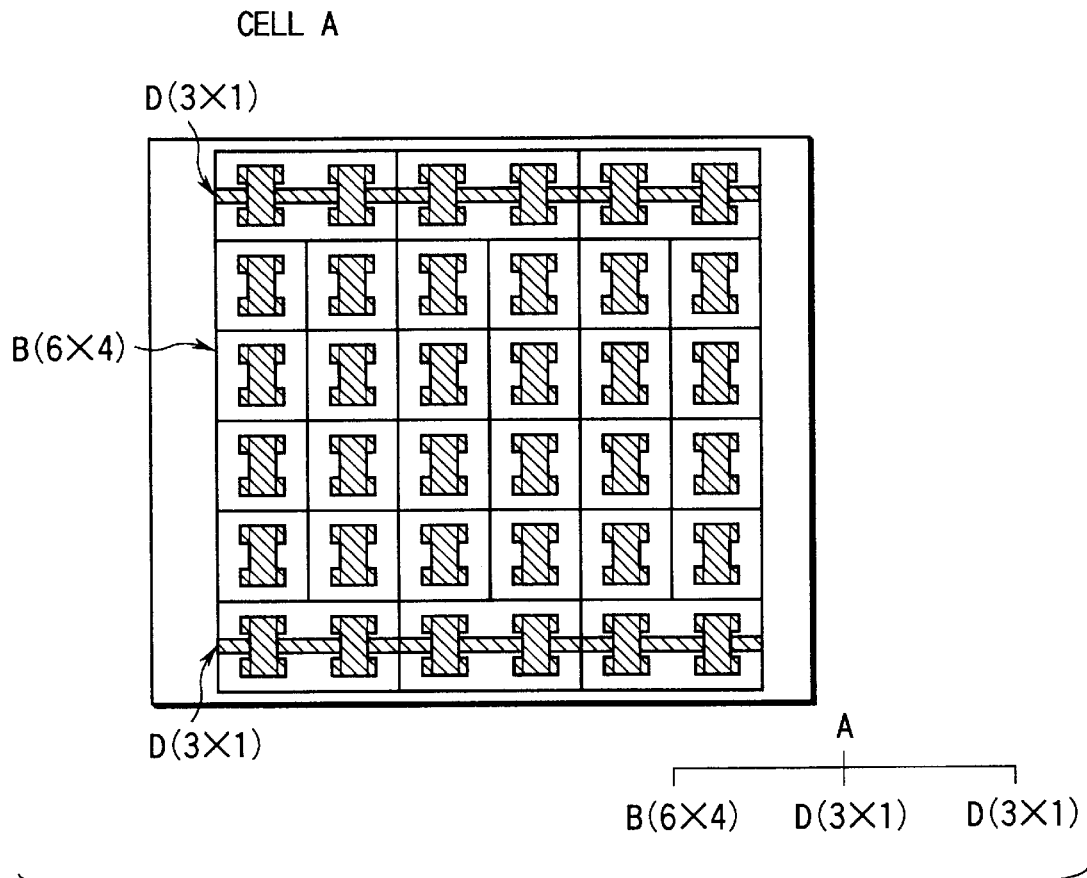
FIGS. 42A, 42B and 42C show a cell hierarchical structure to explain the effect of shortening the shape data operation time in the sixth embodiment.
Figure 42B:
Figure 42C:
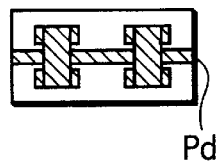

Specifically, the shape data operation to find the geometric sum of layer 1 and layer 2 includes only the process of subjecting shape Pb1, Pd2, and Pd3 in cell D to OR operation as shown in FIG. 41A. In this case, the number of shape data operations is two. FIGS. 42A to 42C show the result of performing the formatting process for the exposure device. In the exposure device, because shapes must be represented in rectangles or triangles, the number of shapes in cell D is 13 and the number of shapes of cell B is 5.

On the other hand, in the prior art, when overlapping cells are exploded into a higher level in hierarchical optimization, all of the shapes of cell B and cell C are exploded so that they may belong to cell A in the design data of FIG. 37A. In this case, the number of processes needed to find the geometric sum of layer 1 and layer 2 is 12. As a result, in the sixth embodiment, the processing time required for shape data operation is ⅙ of that in the prior art.

Figure 43:
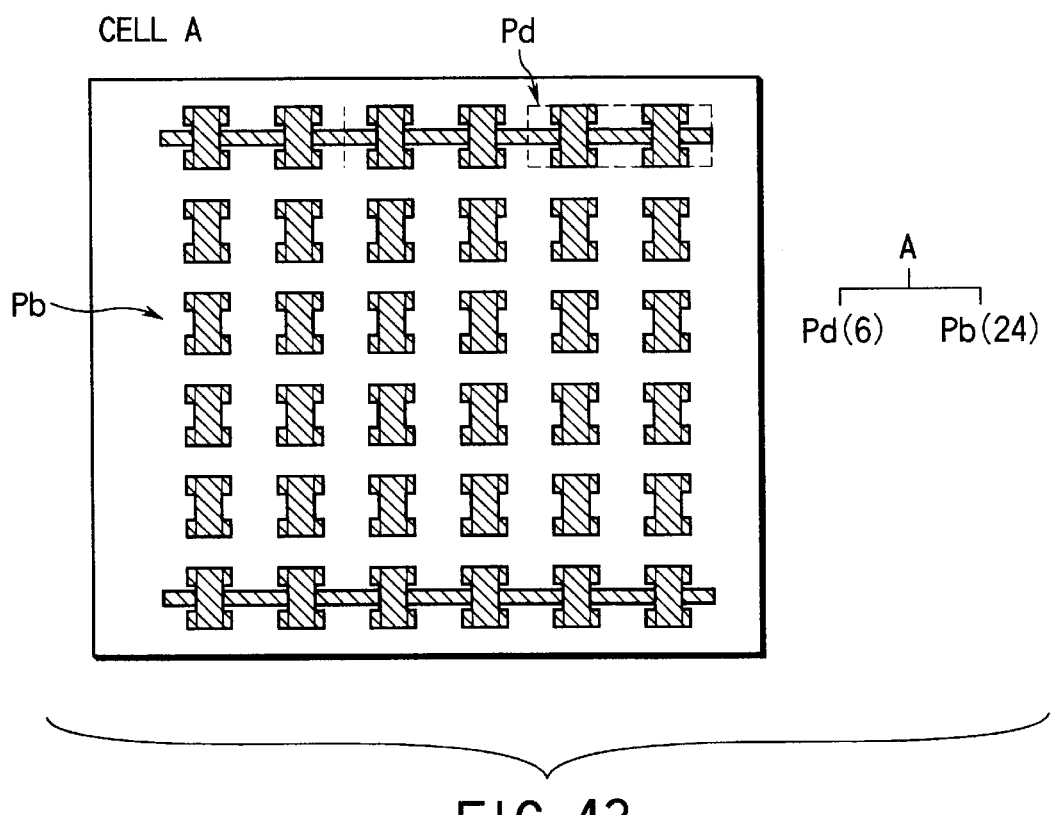
FIG. 43 shows a comparable cell hierarchical structure to explain the effect of shortening the shape data operation time in the sixth embodiment.

In the prior art shown in FIG. 43, the number of pattern data items is 198, whereas it is 18 in the sixth embodiment shown in FIG. 42A. Since the amount of shape data in the exposure data is proportional to the number of shapes, the amount of pattern data in the sixth embodiment decreases to 1/11 of that in the prior art.

In the comparison of the present embodiment with the prior art equivalent, the effect of shortening the shape data operation time and the effect of compressing the amount of pattern data in the exposure data are inversely proportional to the product of the number of repetitions of array.

As explained above, while in the sixth embodiment, the method of performing the preprocess before the hierarchical optimization process in the conventional hierarchical process has been explained, the preprocess may be incorporated in the conventional hierarchical optimization process.

As described above, with the present invention, in a charged beam exposure data generating method of generating exposure data for a multistage-deflection charged beam exposure device from design data, the exposure device having a main deflector and a sub-deflector and writing a shape on a specimen, the process of dividing a shape larger than the size of the minimum subfield area into shapes equal to or smaller than the size of a subfield area and restructuring the shape is performed before the generation of subfield exposure data, in order to prevent the shape from being divided during the generation of subfield exposure data.

Furthermore, in a charged beam exposure data generating method of generating exposure data for a multistage-deflection charged beam exposure device from design data, the exposure device having a main deflector and a sub-deflector and writing a shape on a specimen, the process of extracting the same ones from the shapes in a cell and restructuring them in another cell is performed before the generation of subfield exposure data.

This makes it possible to create exposure data the amount of which has been compressed without increasing the time needed to convert design data into exposure data.

Furthermore, in a charged beam exposure data generating method of converting design data defined on a multilayer cell structure into pattern data for charged beam writing by subjecting the hierarchical structure of the inputted design data to an optimization process and then performing a shape data operation process intended for at least one input layer for each level of hierarchy, the hierarchical optimization process includes a hierarchical structure changing process. The hierarchical structure changing process comprises the step of finding an area in which the child cells defined for reference in a parent cell in the design data are completely covered with a shape belonging to the parent cell, the step of finding an outline frame used to put a shape in the parent cell into a child cell in the area, and the step of deleting the shape in the parent cell existing in the area frame from the parent cell and of, when a child cell is in a single arrangement, putting the deleted shape into the child cell and registering the resulting cell as a new child cell, or when a child cell is in an array arrangement, extracting the rectangular portion defined on the array repetition unit lengths in the directions of x and y of the child cell from the deleted shape and putting the extracted portion into the child cell to form a new child cell.

Furthermore, in a charged beam exposure data generating method of converting design data defined on a multilayer cell structure into pattern data for charged beam writing by subjecting the hierarchical structure of the inputted design data to an optimization process and then performing a shape data operation process intended for at least one input layer for each level of hierarchy, the hierarchical optimization process includes a hierarchical structure changing process. The hierarchical structure changing process comprises the step of finding the overlapping area of the array arrangement of cell A and that of cell B each of which is defined for reference once or more in a cell in the design data, the step of, based on the seed pattern of cell A and that of cell B in the overlapping area, generating a new seed pattern C having a unit length defined by a common multiple of the array repetition unit length of cell A and that of cell B, and the step of replacing the array arrangement of cell A and that of cell B in the overlapping area with the array arrangement of cell C.

Furthermore, in a charged beam exposure data generating method of converting design data defined on a multilayer cell structure into pattern data for charged beam writing by subjecting the hierarchical structure of the inputted design data to an optimization process and then performing a shape data operation process intended for at least one input layer for each level of hierarchy, the hierarchical optimization process includes a hierarchical structure changing process. The hierarchical structure changing process comprises the step of finding the overlapping area of the array arrangement of cell A and that of cell B each of which is defined for reference once or more in a cell in the design data, the step of generating a new cell by dividing and combining the arrays based on information on the hierarchy of the design data so that the circumscribed rectangles of cells may not overlap and be repeated as many times as possible in the array overlapping area, and the step of replacing the array of cell A and that of cell B in the overlapping area with the new cell.

This makes it possible to create pattern data without decreasing the efficiency of the hierarchical process even when there are overlaps between cells. When the overlapping cells in the design data are changed into a hierarchical structure without overlapping cells, this is done based on repetition information defined by the design data. Therefore, it is not necessary to identify a repetitive shape through pattern matching or the like, which makes it easy to change the process of changing the hierarchical structure.

The present invention is not limited to the above embodiments and may be practiced or embodied in still other ways without departing from the spirit or essential character thereof. The present invention is characterized by the generation of exposure data. As a consequence, the exposure device is not restricted to the configuration shown in FIG. 2. While the embodiments, the electron beam exposure device of the main-sub two-stage type has been used, an electron beam exposure device of the multistage deflection type, which performs sub-deflection in two stages or more, may be used. The present invention is applicable to an ion-beam exposure device and a laser-beam exposure device in addition to an electron beam exposure device.

What is claimed is:

1. A method of generating from design data having a multilayer structure exposure data necessary to form a pattern on a specimen with a multistage-deflection charged beam exposure device having a main deflector and at least one sub-deflector, said method comprising the following steps of:

subjecting a hierarchical structure of the design data to an optimization process to obtain an optimized design data;

compressing the optimized design data by dividing a large pattern larger than the size corresponding to a minimum subfield area into small patterns equal to or smaller than the size of the minimum subfield area to prevent the large pattern from being divided into small patterns during generation of subfield exposure data; and generating subfield exposure data based on compressed design data in which the large pattern has been divided into the small patterns.

2. A method of generating from design data formed of cells and having a multilayer structure exposure data necessary to form a pattern on a specimen with a multistage-deflection charged beam exposure device having a main deflector and at least one sub-deflector, said method comprising the following steps of:

subjecting a hierarchical structure of the design data to an optimization process to obtain an optimized design data;

compressing the optimized design data by extracting patterns which are repeated from all patterns in one cell and rearranging the extracted patterns in another cell; and generating based on the compressed design data subfield exposure data in which the patterns of the one cell, which are repeated, have been rearranged in the other cell.

3. A method of generating from design data defined on a multilayer cell structure exposure data necessary to form a pattern on a specimen with a charged beam or laser-beam exposure device, said method comprising the following steps of:

subjecting a hierarchical structure of the design data to an optimization process; and converting the design data into exposure data by subjecting the design data at each level of hierarchy to a specific shape data operation process intended for at least one layer, wherein said step of subjecting the hierarchical structure to the optimization process comprises the following substeps of:

finding an area in which child cells defined for reference in a parent cell in the design data are completely covered with a shape belonging to the parent cell;

determining an outline frame used to put a shape in the parent cell into a child cell in the area; and deleting the shape in the parent cell existing in the outline frame from the parent cell and of, when a child cell is in a single arrangement, putting the deleted shape into the child cell and registering the resulting cell as a new child cell, or when a child cell is in an array arrangement, extracting a rectangular portion defined on an array repetition unit lengths in the directions of x and y of the child cell from the deleted shape and putting the extracted portion into the child cell to form a new child cell.

4. A method of generating from design data defined on a multilayer cell structure exposure data necessary to form a pattern on a specimen with a charged beam or laser-beam exposure device, said method comprising the following steps of:

subjecting a hierarchical structure of the design data to an optimization process; and converting the design data into exposure data by subjecting the design data at each level of hierarchy to a specific shape data operation process intended for at least one layer, wherein the step of subjecting the hierarchical structure to the optimization process comprises the following substeps of:

determining an overlapping area of an array arrangement of a first cell and that of a second cell each of which is defined for reference once or more in a cell in the design data;

generating a new cell having a unit length defined by a common multiple of an array repetition unit length of the first cell and that of the second cell, based on patterns of the first cell and that of the second cell in the overlapping area; and replacing the array arrangement of the first cell and that of the second cell with the array arrangement of a third cell in which patterns originally belonging to the first or second cells exist.

5. A method of generating from design data define on a multilayer cell structure exposure data necessary to form a pattern on a specimen with a charged beam or laser-beam exposure device, said method comprising the following steps of:

subjecting a hierarchical structure of the design data to an optimization process; and converting the design data into the exposure data by subjecting the design data at each level of hierarchy to a specific shape data operation process intended for at least one layer, wherein the step of subjecting the hierarchical structure to the optimization process comprises the following substeps of:

determining an overlapping area of an array arrangement of a first cell and that of a second cell each of which is defined for reference once or more in a cell in the design data;

generating a new cell by dividing and combining arrays based on information on the hierarchy of the design data so that circumscribed rectangles of cells may not overlap and may be repeated as many times as possible in the array arrangement overlapping area; and replacing the array of the first cell and that of the second cell in the overlapping area with the new cell.

6. A device for converting design pattern data of a multilayer cell structure into exposure data for a two-stage-deflection charged beam exposure device with a main deflector and a sub-deflector, comprising:

means for changing a hierarchical structure of design data so as to enable a hierarchical shape data operation process suitable for the charged beam exposure device by subjecting the design data to a hierarchical optimization process including at least cell overlapping removal and resizing;

means for subjecting the hierarchically optimized design data to a hierarchical shape data operation process including at least a tone reversal process, a mirror inversion process, a resizing process, and a trapezoidal division;

means which compresses the design data subjected to the hierarchical shape data operation process and which checks a shape equal to or larger than a subfield size of all the shapes subjected to the shape data operation process to see whether the shape can be represented by repetition of unit cells of a rectangle of the subfield size, whether the shape can be represented by the repetition of a combination of unit cells and arbitrary cells of rectangles of arbitrary sizes, or whether the shape can be represented by repetition of arbitrary cells, and if the shape can be represented by one of these repetitions, changes the hierarchical structure of the cells;

means for subjecting cells larger than the subfield size to a subfield division process; and means for sorting the cells into the individual frames.

7. A device according to claim 6, wherein said compression means comprises:

means for extracting a cell subjected to the hierarchical shape data operation;

means which makes comparison to see whether or not the size (fx, fy) of a shape included in the extracted cell is larger than the subfield size, and if it is larger than the subfield size, generates the following repetition information from the shape size and the subfield size (sfs):

fx/sfs=Nx with Rx, where Nx is the quotient (an integer) and Rx is the remainder (an integer)

fy/sfs=Ny with Ry, where Ny is the quotient (an integer) and Ry is the remainder (an integer)

fx/(Nx+1)=Gx fy/(Ny+1)=Gy fx/Gx=NxG fy/Gy=NyG.

8. A device according to claim 6, wherein said compression means comprises:

means for extracting a cell subjected to the hierarchical shape data operation;

means for determining a shape form, shape size, and shape arrangement position for all of the shapes in the extracted cell;

means for generating a shape arrangement position table for each of the same shape forms and the same shape sizes;

means for calculating a pitch from each arrangement position to each shape; and means which judges whether or not each of the shapes in the cell can be represented by repetition, and which determines shapes representable by repetition to be arbitrary cells and changes the hierarchical structure, whereas leaving shapes not representable by repetition in the original cell.

9. A device according to claim 6, wherein said hierarchical structure changing means comprises:

means for finding an area in which child cells defined for reference in a parent cell in the design data are completely covered with a shape belonging to the parent cell;

means for determining an outline frame used to put a shape in the parent cell into a child cell in the area; and means for deleting the shape in the parent cell existing in the outline frame from the parent cell and of, when a child cell is in a single arrangement, putting the deleted shape into the child cell and registering the resulting cell as a new child cell, or when a child cell is in an array arrangement, extracting a rectangular portion defined on an array repetition unit lengths in the directions of x and y of the child cell from the deleted shape and putting the extracted portion into the child cell to form a new child cell.

10. A device according to claim 6, wherein said hierarchical structure changing means comprises:

means for determining an overlapping area of an array arrangement of a first cell and that of a second cell each of which is defined for reference once or more in a cell in the design data;

means for generating a new cell having a unit length defined by a common multiple of an array repetition unit length of the first cell and that of the second cell, based on patterns of the first cell and that of the second cell in the overlapping area; and means for replacing the array arrangement of the first cell and that of the second cell with the array arrangement of a third cell in which patterns originally belonging to the first or second cells exist.

11. A device according to claim 6, wherein said hierarchical structure changing means comprises:

means for determining an overlapping area of an array arrangement of a first cell and that of a second cell each of which is defined for reference once or more in a cell in the design data;

means for generating a new cell by dividing and combining arrays based on information on the hierarchy of the design data so that circumscribed rectangles of cells may not overlap and may be repeated as many times as possible in the array arrangement overlapping area; and means for replacing the array of the first cell and that of the second cell in the overlapping area with the new cell.

* * * * *